(12) United States Patent
Su et al.

(10) Patent No.: US 12,535,739 B2
(45) Date of Patent: Jan. 27, 2026

(54) METHOD OF FORMING PHOTORESIST PATTERN

(71) Applicant: TAIWAN SEMICONDUCTOR MANUFACTURING COMPANY, LTD., Hsinchu (TW)

(72) Inventors: Yu-Chung Su, Hsinchu (TW); Tsung-Han Ko, New Taipei (TW); Ching-Yu Chang, Yuansun Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/231,006

(22) Filed: Aug. 7, 2023

(65) Prior Publication Data

US 2024/0077802 A1  Mar. 7, 2024

Related U.S. Application Data

(63) Continuation of application No. 17/098,238, filed on Nov. 13, 2020.

(60) Provisional application No. 62/956,018, filed on Dec. 31, 2019.

(51) Int. Cl.
| | |
|---|---|
| *G03F 7/11* | (2006.01) |
| *G03F 7/004* | (2006.01) |
| *G03F 7/38* | (2006.01) |

(52) U.S. Cl.
CPC .............. *G03F 7/11* (2013.01); *G03F 7/0045* (2013.01); *G03F 7/38* (2013.01)

(58) Field of Classification Search
CPC . G03F 7/11; G03F 7/0045; G03F 7/38; G03F 7/0046; G03F 7/095
See application file for complete search history.

(56) References Cited

U.S. PATENT DOCUMENTS

| | | |
|---|---|---|
| 8,796,666 B1 | 8/2014 | Huang et al. |
| 9,093,530 B2 | 7/2015 | Huang et al. |
| 9,213,234 B2 | 12/2015 | Chang |

(Continued)

FOREIGN PATENT DOCUMENTS

| | | |
|---|---|---|
| CN | 103972118 A | 8/2014 |
| CN | 104810402 A | 7/2015 |

(Continued)

OTHER PUBLICATIONS

Final Office Action issued in U.S. Appl. No. 17/098,238, dated May 3, 2023.

(Continued)

*Primary Examiner* — Jonathan Johnson
*Assistant Examiner* — Alexander N. Lee
(74) *Attorney, Agent, or Firm* — STUDEBAKER BRACKETT PLLC

(57) ABSTRACT

A method of forming a photoresist pattern includes forming a protective layer over a photoresist layer formed on a substrate. The protective layer and the photoresist layer are selectively exposed to actinic radiation. The photoresist layer is developed to form a pattern in the photoresist layer. The protective layer includes a polymer without a nitrogen-containing moiety, and a basic quencher, an organic acid, a photoacid generator, or a thermal acid generator.

20 Claims, 19 Drawing Sheets

(56) References Cited

U.S. PATENT DOCUMENTS

| | | |
|---|---|---|
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 9,857,684 B2 | 1/2018 | Lin et al. |
| 9,859,206 B2 | 1/2018 | Yu et al. |
| 9,875,892 B2 | 1/2018 | Chang et al. |
| 10,497,608 B2 | 12/2019 | Shin et al. |
| 11,127,704 B2 | 9/2021 | Tsai et al. |
| 2001/0024763 A1* | 9/2001 | Choi .................... C08F 232/08 522/182 |
| 2001/0033994 A1 | 10/2001 | Ohsawa et al. |
| 2001/0036589 A1 | 11/2001 | Kinoshita et al. |
| 2006/0003252 A1* | 1/2006 | Hirayama .............. C08L 83/06 430/192 |
| 2007/0069346 A1 | 3/2007 | Lin et al. |
| 2007/0092829 A1* | 4/2007 | Noelscher ............ G03F 7/0035 430/270.1 |
| 2008/0032202 A1* | 2/2008 | Ishizuka ................ G03F 7/11 430/4 |
| 2009/0234155 A1* | 9/2009 | Oh ........................ C07C 69/712 562/109 |
| 2009/0286188 A1 | 11/2009 | Hatakeyama et al. |
| 2013/0069225 A1 | 3/2013 | Lin et al. |
| 2013/0089820 A1 | 4/2013 | Hatakeyama et al. |
| 2015/0248057 A1 | 9/2015 | Ohnishi et al. |
| 2015/0315011 A1 | 11/2015 | Inaba et al. |
| 2017/0052445 A1 | 2/2017 | Weng et al. |
| 2017/0090287 A1 | 3/2017 | Hong et al. |
| 2017/0351179 A1 | 12/2017 | Goto et al. |
| 2018/0081277 A1* | 3/2018 | Inoue ...................... G03F 7/32 |
| 2018/0118968 A1* | 5/2018 | Kaur ..................... G03F 7/2041 |
| 2019/0011835 A1* | 1/2019 | Yonekuta .............. G03F 7/2006 |
| 2020/0183282 A1* | 6/2020 | Hashimoto ........... C08F 220/06 |

FOREIGN PATENT DOCUMENTS

| | | |
|---|---|---|
| CN | 105016290 A | 11/2015 |
| CN | 109979903 A | 7/2019 |
| CN | 110634755 A | 12/2019 |
| JP | 2006-058404 A | 3/2006 |
| JP | 2006-332289 A | 12/2006 |
| JP | 2014-093324 A | 5/2014 |
| KR | 2015-0052861 A | 5/2015 |
| KR | 2017-0108079 A | 9/2017 |
| KR | 2018-0082607 A | 7/2018 |
| TW | 201016815 A | 5/2010 |
| TW | 201518087 A | 5/2015 |
| WO | 2017/117483 A1 | 7/2017 |

OTHER PUBLICATIONS

Non-Final Office Action issued in U.S. Appl. No. 17/098,238, dated Nov. 22, 2022.

Ogura, Tomohito; Mizoguchi, Katsuhisa; Ueda, Mitsuru, "Development of negative-type photosensitive polyimide, based on poly( amic acid)s, photo base generator and thermal base generator", Journal of Photopolymer Science and Technology, vol. 21, Issue: 1, pp. 125-130, 2008 (Year: 2008).

Jang Young Min; Seo, Ji Young; Chae, Kyu Ho; Yi, Mi Hye, "Positive-type photosensitive polyimide based on a photobase generator containing oxime-urethane groups as a photosensitive compound", Macromol. Res. 14, 300-305 (2006) (Year: 2006).

* cited by examiner

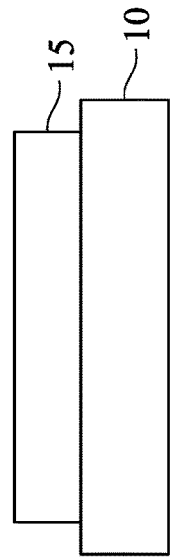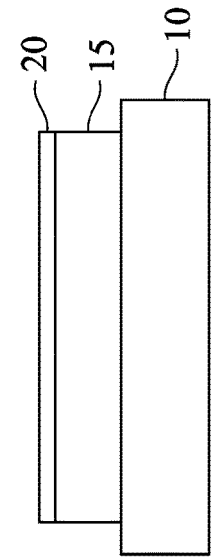
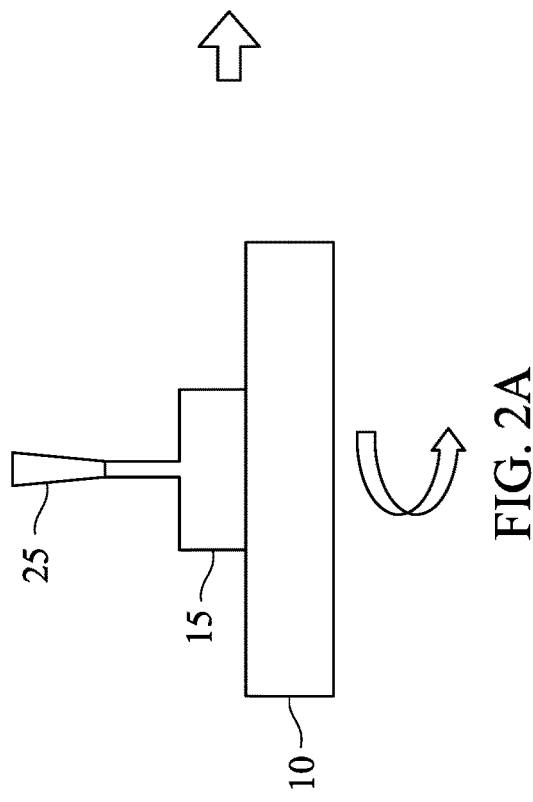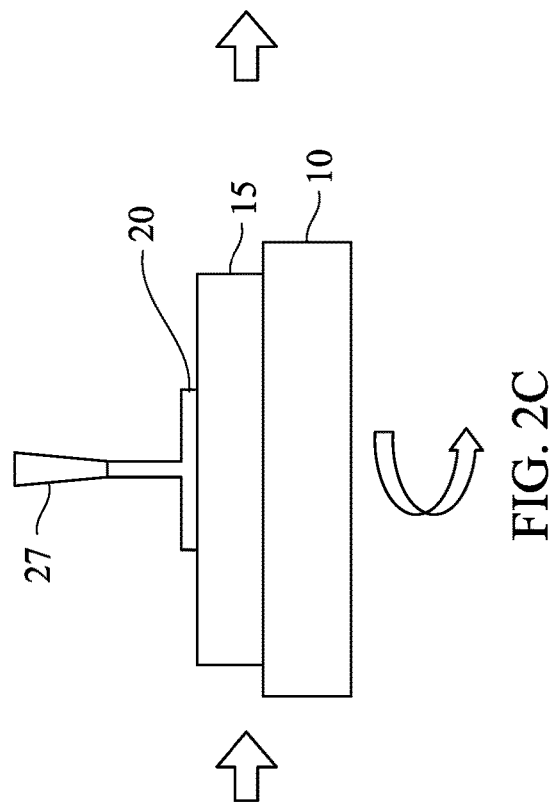

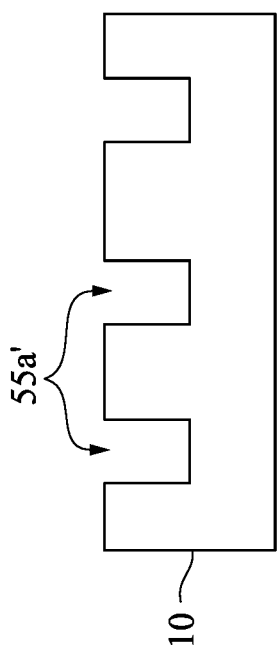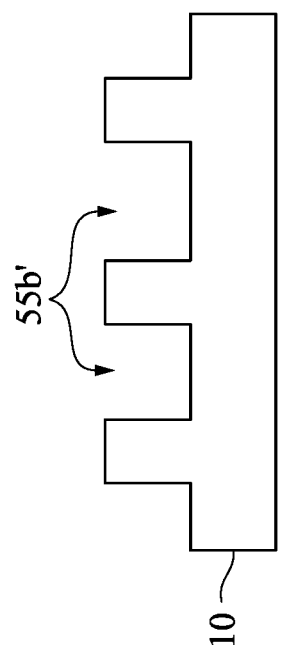

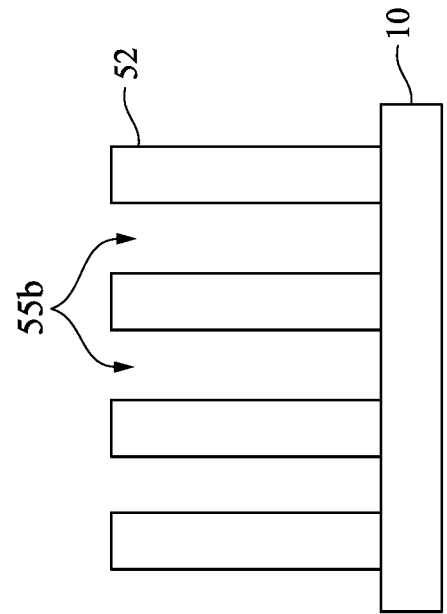
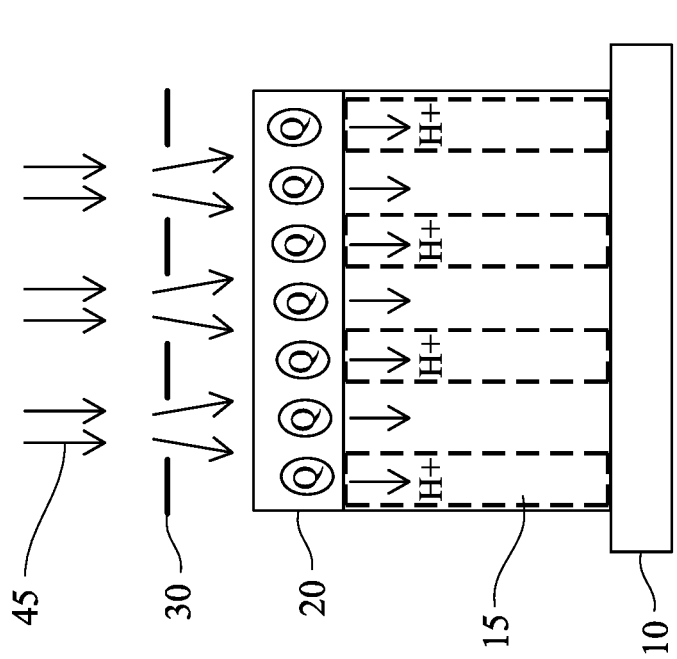
FIG. 7B
FIG. 7A

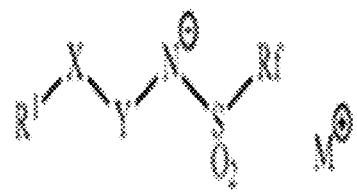
Example:
cation
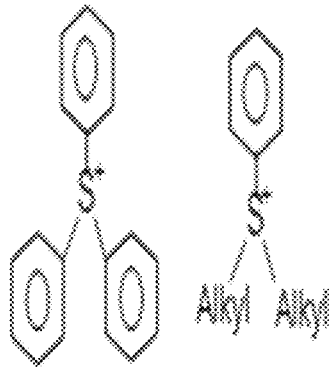
anion
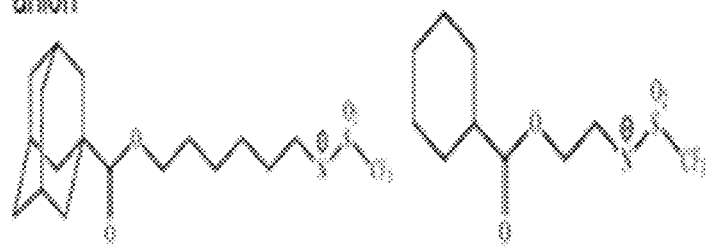
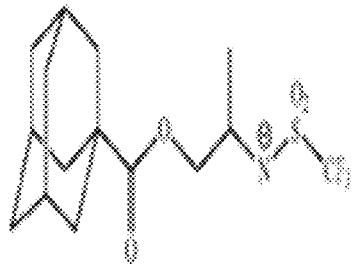
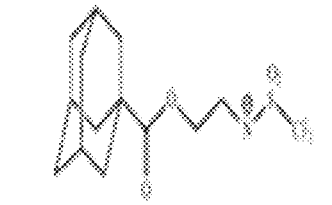
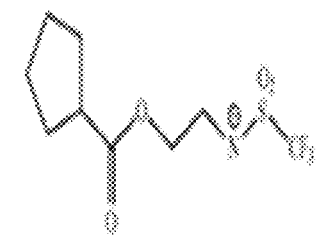
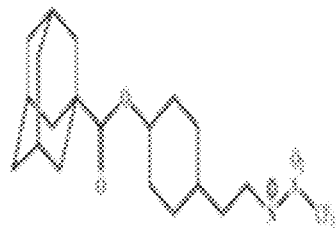
FIG. 17

METHOD OF FORMING PHOTORESIST PATTERN

RELATED APPLICATIONS

This application is a continuation application of U.S. application Ser. No. 17/098,238, filed Nov. 13, 2020, which claims priority to U.S. Provisional Patent Application No. 62/956,018 filed Dec. 31, 2019, the entire content of each of which are incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photosensitive materials. Such materials are applied to a surface and then exposed to an energy that has itself been patterned. Such an exposure modifies the chemical and physical properties of the exposed regions of the photosensitive material. This modification, along with the lack of modification in regions of the photosensitive that were not exposed, can be exploited to remove one region without removing the other.

However, as the pattern pitch decreases some exposure radiation may leak into the regions of the photoresist that are to be unexposed due to light scattering. The leaked exposure radiation can lead to photoresist degradation in the unexposed areas and cause pattern defects. As the size of individual devices has decreased, process windows for photolithographic processing become tighter and tighter. As such, advances in the field of photolithographic processing are necessary to maintain the ability to scale down the devices, and further improvements are needed in order to meet the desired design criteria such that the march towards smaller and smaller components may be maintained.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, and 2D show process stages of sequential operations according to an embodiment of the disclosure.

FIGS. 6A and 6B show process stages of a sequential operation according to embodiments of the disclosure.

FIGS. 7A and 7B show process stages of a sequential operation according to an embodiment of the disclosure.

FIG. 17 illustrates examples of photo decomposable bases.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
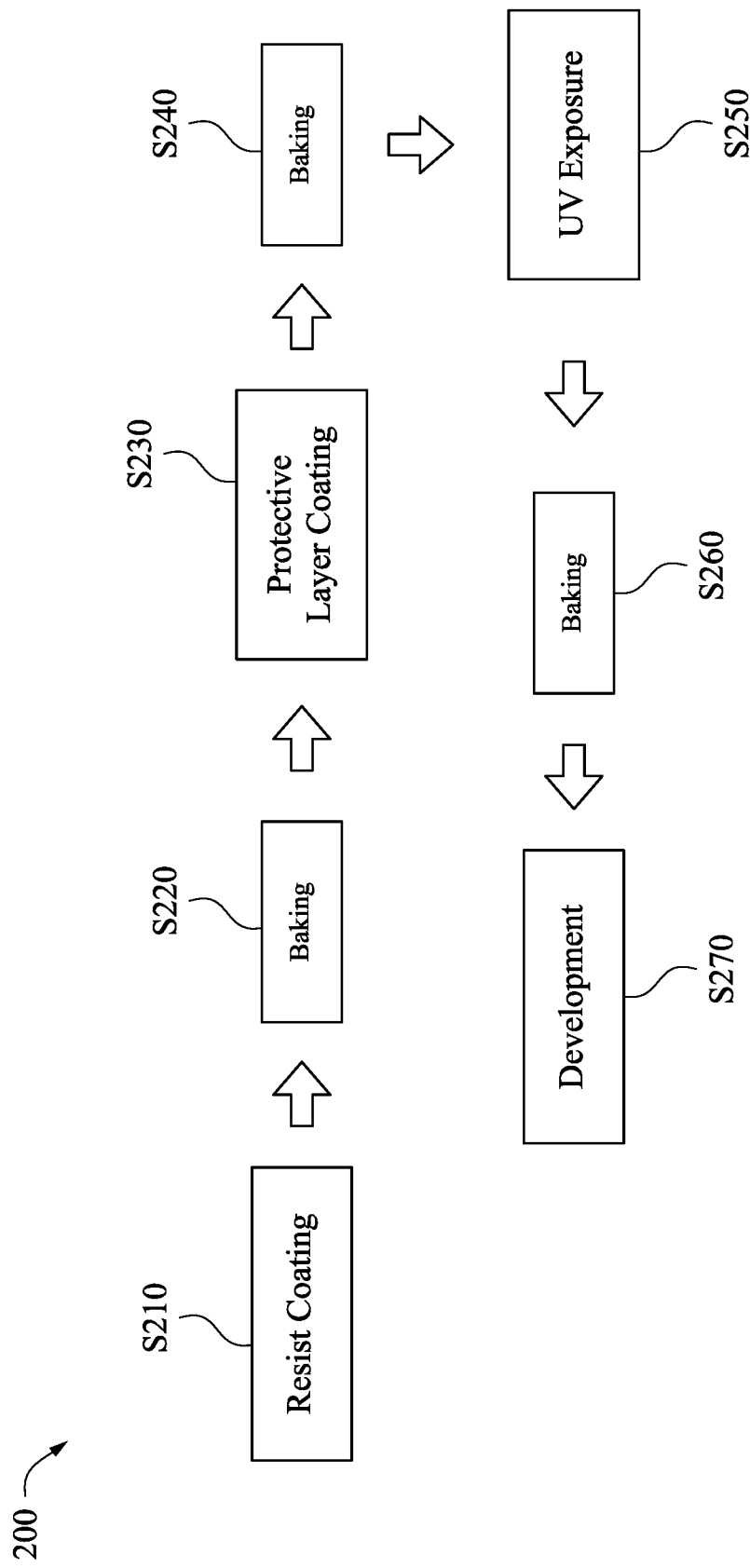
FIG. 1 illustrates a process flow according to embodiments of the disclosure.
Figure 3A:
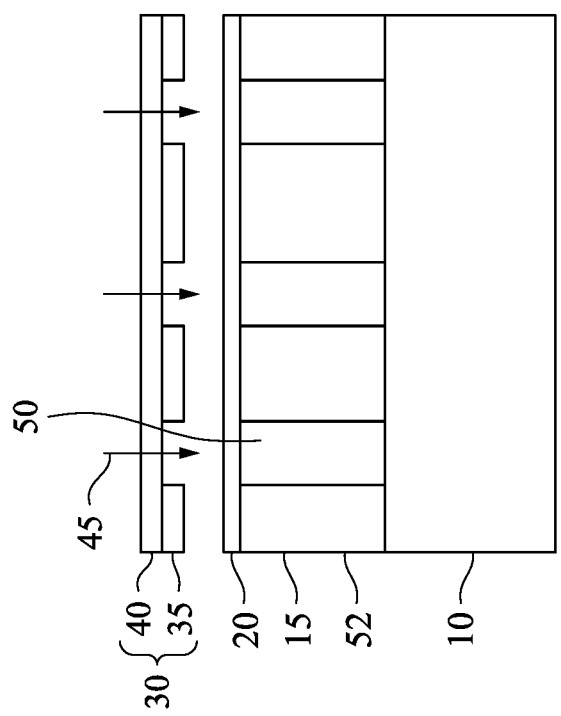
FIGS. 3A and 3B show process stages of a sequential operation according to an embodiment of the disclosure.
Figure 3B:
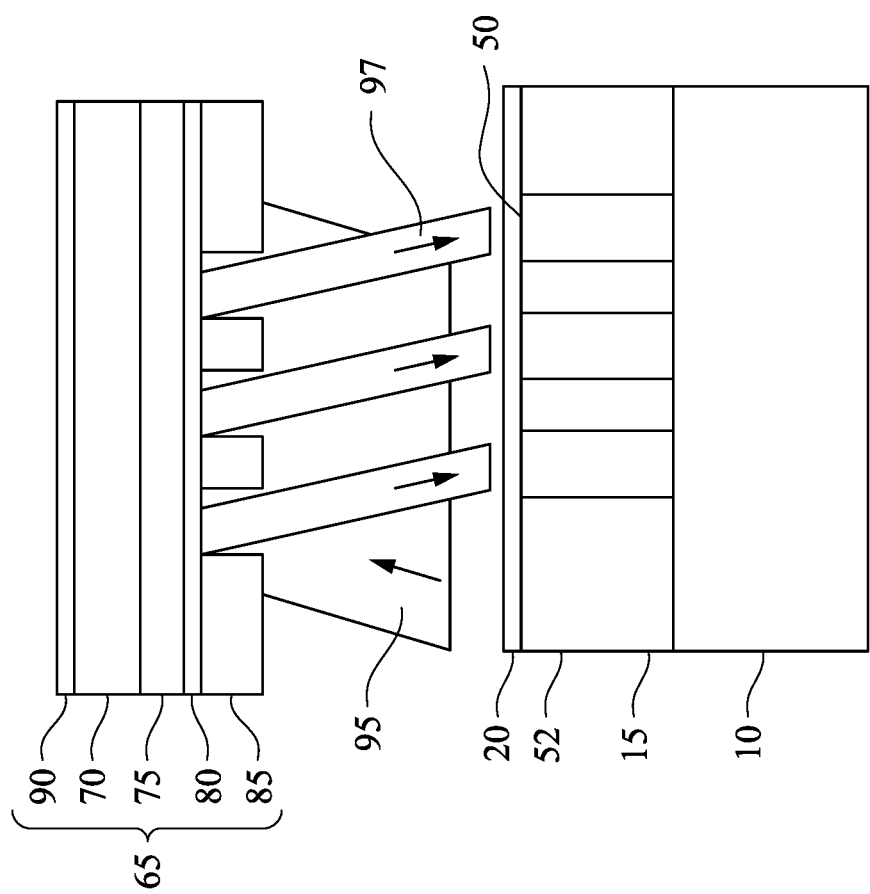

FIG. 1 illustrates a process flow 200 of manufacturing a semiconductor device according to embodiments of the disclosure. FIGS. 2A-6B show process stages of sequential operations according to some embodiments of the disclosure. In operation S210 of FIG. 1, a layer of photoresist 15 formed of a photoresist composition is applied to a substrate 10 or a layer to be patterned, as shown in FIG. 2A. A baking operation is performed in operation S220 of FIG. 1, as shown in FIG. 2B. A protective layer 20 is applied to the photoresist in operation S230, as shown in FIG. 2C, after baking the photoresist in operation S220. After applying the protective layer 220, the protective layer is baked in operation S240, as shown in FIG. 2D. Then the protective layer 20 and the photoresist layer 15 are selectively exposed to ultraviolet radiation in a patternwise manner in operation S250, as shown in FIGS. 3A and 3B. In some embodiments, the photoresist layer 15 is selectively exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the radiation is an electron beam.

Figure 4:
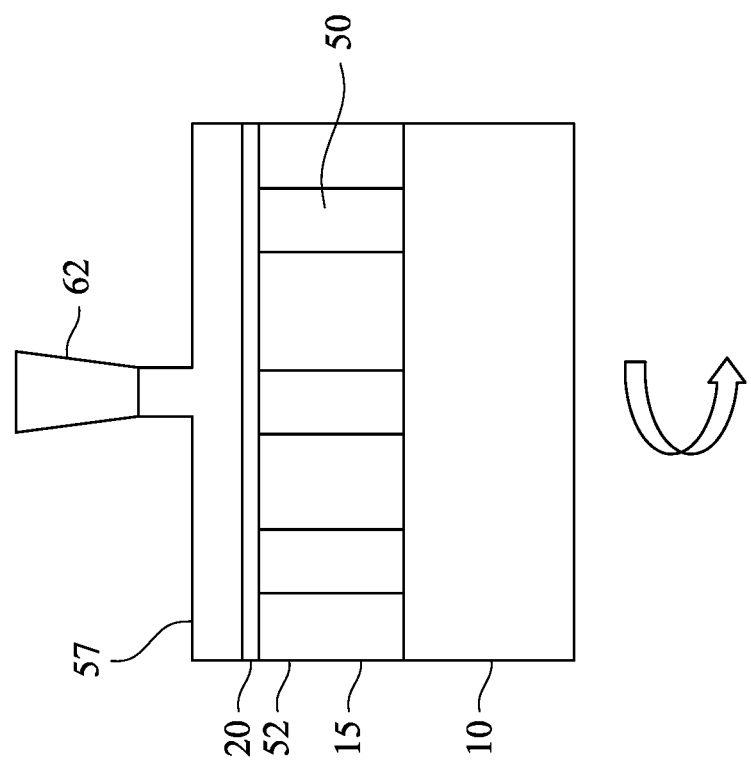
FIG. 4 shows a process stage of a sequential operation according to an embodiment of the disclosure.
Figure 5A:
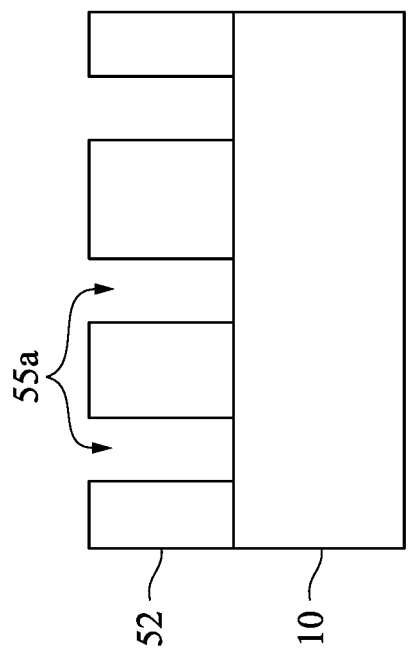
FIGS. 5A and 5B show process stages of a sequential operation according to an embodiment of the disclosure.
Figure 5B:
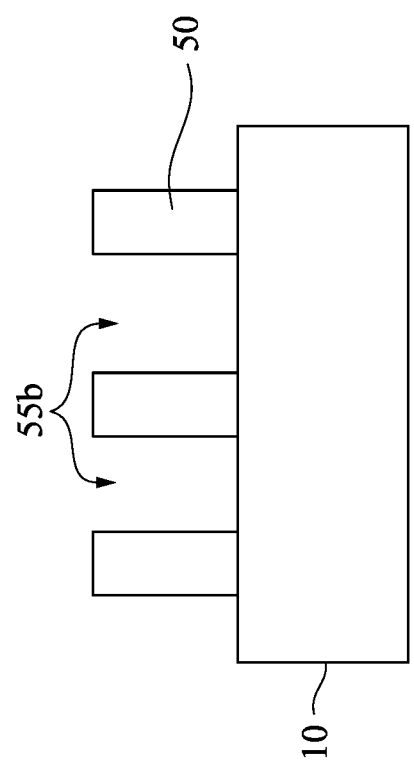

The exposed protective layer and photoresist layer are then post-exposure baked in operation S260 in some embodiments. A developer 57 is applied to the protective layer 20 and photoresist layer 15 in development operation S270 to form the patterned photoresist layer 55a, 55b, as shown in FIGS. 4, 5A, and 5B. The baking operations S220, S240 are performed at a baking temperature between about 40° C. and about 120° C. and the baking operation S260 is performed at a baking temperature between about 50° C. and about 150° C. in some embodiments. The pre-exposure baking operations S220, S240 remove solvents from the photoresist layer and protective layer (i.e.—dry the photoresist and protective layers). The post-exposure baking may be used in order to assist in the generating, dispersing, and reacting of the acid/base/free radical generated from the impingement of the radiation upon the photoresist layer 15 during the exposure. Such assistance helps to create or enhance chemical reactions which generate chemical differences between the exposed regions and the unexposed regions within the photoresist layer. These chemical differences also cause differences in the solubility between the exposed regions and the unexposed regions.

In some embodiments, each of the photoresist layer 15 and protective layer 20 are applied using a process such as a spin-on coating process, a dip coating method, an air-knife coating method, a curtain coating method, a wire-bar coating method, a gravure coating method, a lamination method, an extrusion coating method, combinations of these, or the like. As shown in FIGS. 2A and 2C, in some embodiments, the substrate 10 is rotated during or after the photoresist layer or protective layer is applied to the substrate.

As shown in FIG. 3A, the exposure radiation 45 passes through a photomask 30 before irradiating the photoresist layer 15 in some embodiments. In some embodiments, the photomask has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

In some embodiments, the selective exposure of the photoresist layer 15 to form exposed regions 50 and unexposed regions 52 is performed using extreme ultraviolet lithography. In an extreme ultraviolet lithography operation a reflective photomask 65 is used to form the patterned exposure light, as shown in FIG. 3B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are between the reflective photomask 65 and the photoresist-coated substrate.

The region of the photoresist layer exposed to radiation 50 undergoes a chemical reaction thereby changing its solubility in a subsequently applied developer relative to the region of the photoresist layer not exposed to radiation 52. In some embodiments, the portion of the photoresist layer exposed to radiation 50 undergoes a crosslinking reaction. In other embodiments, the photoresist includes a polymer with pendant groups that undergo a decomposition reaction when exposed to radiation 45.

Next, the photoresist layer 15 undergoes a post-exposure bake in operation S260. In some embodiments, the photoresist layer 15 is heated to a temperature of about 50° C. and 160° C. for about 20 seconds to about 120 seconds. The post-exposure baking may be used in order to assist in the generating, dispersing, and reacting of the acid/base/free radical generated from the impingement of the radiation 45/97 upon the photoresist layer 15 during the exposure (operation S250). Such assistance helps to create or enhance chemical reactions, which generate chemical differences between the exposed region 50 and the unexposed region 52 within the photoresist layer. These chemical differences also cause differences in the solubility between the exposed region 50 and the unexposed region 52.

The selectively exposed photoresist layer is subsequently developed by applying a developer to the selectively exposed photoresist layer in operation S270. As shown in FIG. 4, a developer 57 is supplied from a dispenser 62 to the photoresist layer 15. In some embodiments, the exposed portion of the photoresist layer 50 is removed by the developer 57 forming a pattern of openings 55a in the photoresist layer 15 to expose the substrate 10, as shown in FIG. 5A. In other embodiments, the unexposed portion of the photoresist layer 52 is removed by the developer 57 forming a pattern of openings 55b in the photoresist layer 15 to expose the substrate 10, as shown in FIG. 5B. In some embodiments, the developer 57 removes the portions of the protective layer 20 exposed to the actinic radiation 45 and not exposed to the actinic radiation 45 (i.e.—the entire the protective layer). In some embodiments, a first solvent is applied during the development operation S270 to remove the protective layer 20, and then a second solvent different from the first solvent is applied to develop the pattern 55a, 55b in the photoresist layer 15.

In some embodiments, the pattern of openings 55a, 55b in the photoresist layer 15 are extended into the layer to be patterned or substrate 10 to create a pattern of openings 55a', 55b' in the substrate 10, thereby transferring the pattern in the photoresist layer 15 into the substrate 10, as shown in FIGS. 6A and 6B. The pattern is extended into the substrate by etching, using one or more suitable etchants. The portion of the photoresist layer remaining after development 50, 52 is at least partially removed during the etching operation in some embodiments. In other embodiments, the portion of the photoresist layer 50, 52 remaining after development is removed after etching the substrate 10 by using a suitable photoresist stripper solvent or by a photoresist ashing operation.

In some embodiments, the substrate 10 includes a single crystalline semiconductor layer on at least its surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

The photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are either positive tone resists or negative tone resists. A positive tone resist refers to a photoresist material that when exposed to radiation, such as UV light, becomes soluble in a developer, while the region of the photoresist that is non-exposed (or exposed less) is insoluble in the developer (see FIG. 5A). A negative tone resist, on the other hand, refers to a photoresist material that when exposed to radiation becomes insoluble in the developer, while the region of the photoresist that is non-exposed (or exposed less) is soluble in the developer (see FIG. 5B). The region of a negative resist that becomes insoluble upon exposure to radiation may become insoluble due to a cross-linking reaction caused by the exposure to radiation.

Whether a resist is a positive tone or negative tone may depend on the type of developer used to develop the resist. For example, some positive tone photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development.

In some embodiments, the thickness of the protective layer 20 is sufficiently thin so that the protective layer 20 does not adversely affect the exposure of the photoresist layer 15 to the radiation 45. In some embodiments, the protective layer has a thickness ranging from about 0.1 nm to about 20 nm. In some embodiments, the thickness of the protective layer ranges from about 1 nm to about 15 nm. In some embodiments, the contact angle of the protective layer to water is greater than 75°.

Photoresist compositions according to the present disclosure include a polymer along with one or more photoactive compounds (PACs) in a solvent, in some embodiments. In some embodiments, the polymer includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

In some embodiments, the photoresist includes a polymer having acid labile groups selected from the following:

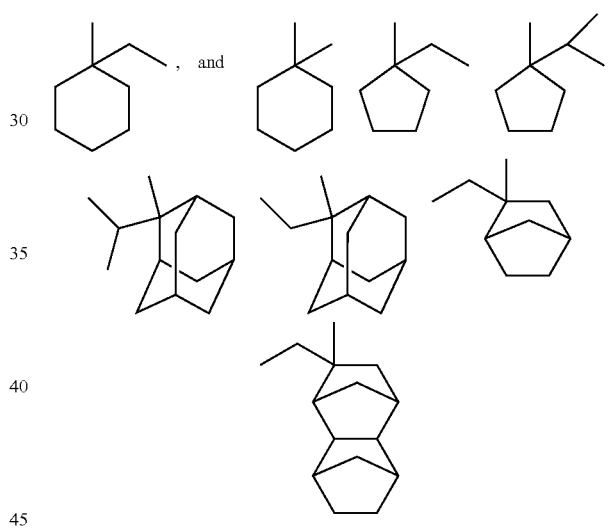

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy) ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

The group which will decompose, otherwise known as a leaving group, is attached to the hydrocarbon structure so that, it will react with the acids/bases/free radicals generated by the PACs during exposure. Leaving groups that react with acids are known as acid labile groups. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl) (alkyl-carbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

Figure 15:
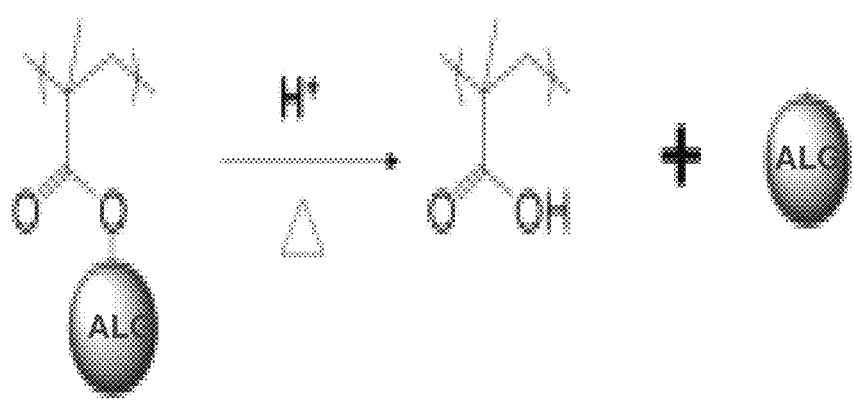
FIG. 15 illustrates an ALG de-protect reaction.

In some embodiments, the acid labile group (ALG) decomposes by the action of the acid generated by the photoacid generator leaving a carboxylic acid group pendant to the polymer chain, as shown by the ALG de-protect reaction in FIG. 15.

In some embodiments, the polymer also includes other groups attached to the hydrocarbon structure that help to improve a variety of properties of the polymerizable resin. For example, inclusion of a lactone group to the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer includes groups that can assist in increasing the adhesiveness of the photoresist layer 15 to underlying structures (e.g., substrate 10). Polar groups may be used to help increase the adhesiveness. Suitable polar groups include hydroxyl groups, cyano groups, or the like, although any suitable polar group may, alternatively, be used.

Optionally, the polymer includes one or more alicyclic hydrocarbon structures that do not also contain a group, which will decompose in some embodiments. In some embodiments, the hydrocarbon structure that does not contain a group, which will decompose, includes structures such as 1-adamantyl(meth)acrylate, tricyclodecanyl (meth)acrylate, cyclohexyl (meth)acrylate, combinations of these, or the like.

Embodiments of the photoresist include one or more photoactive compounds (PACs). The PACs are photoactive components, such as photoacid generators, photo base generators, free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol); trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

Figure 16:
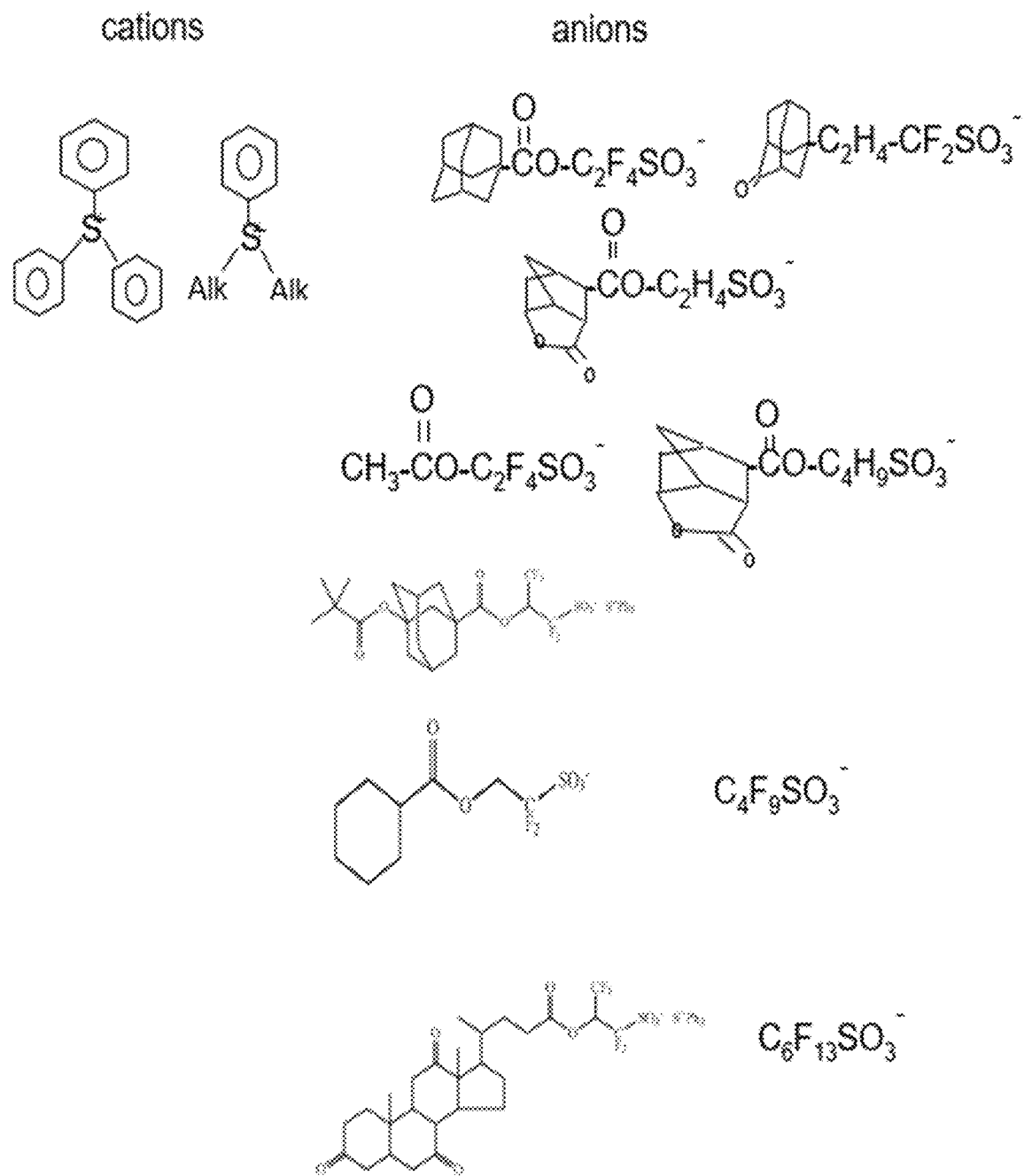
FIG. 16 illustrates examples of photoacid generators.

Structures of photoacid generators according to the embodiments of the disclosure include compounds formed from the cations and anions illustrated in FIG. 16.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimer; combinations of these, or the like.

In some embodiments in which the PACs are photobase generators, the PACs include quaternary ammonium dithiocarbamates, α aminoketones, oxime-urethane containing molecules such as dibenzophenoneoxime hexamethylene diurethan, ammonium tetraorganylborate salts, and N-(2-nitrobenzyloxycarbonyl) cyclic amines, combinations of these, or the like.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

In some embodiments, a cross-linking agent is added to the photoresist. The cross-linking agent reacts with one group from one of the hydrocarbon structures in the polymer and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

In some embodiments the cross-linking agent has the following structure:

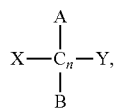

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the cross-linking agent include the following:

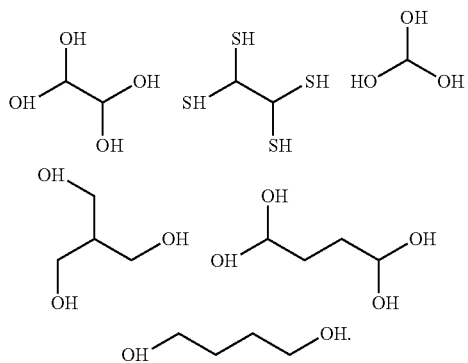

Alternatively, instead of or in addition to the cross-linking agent being added to the photoresist composition, a coupling reagent is added in some embodiments, in which the coupling reagent is added in addition to the cross-linking agent. The coupling reagent assists the cross-linking reaction by reacting with the groups on the hydrocarbon structure in the polymer before the cross-linking reagent, allowing for a reduction in the reaction energy of the cross-linking reaction and an increase in the rate of reaction. The bonded coupling reagent then reacts with the cross-linking agent, thereby coupling the cross-linking agent to the polymer.

Alternatively, in some embodiments in which the coupling reagent is added to the photoresist without the cross-linking agent, the coupling reagent is used to couple one group from one of the hydrocarbon structures in the polymer to a second group from a separate one of the hydrocarbon structures in order to cross-link and bond the two polymers together. However, in such an embodiment the coupling reagent, unlike the cross-linking agent, does not remain as part of the polymer, and only assists in bonding one hydrocarbon structure directly to another hydrocarbon structure.

In some embodiments, the coupling reagent has the following structure:

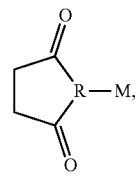

where R is a carbon atom, a nitrogen atom, a sulfur atom, or an oxygen atom; M includes a chlorine atom, a bromine atom, an iodine atom, —NO$_2$; —SO$_3$—; —H—; —CN; —NCO, —OCN; —CO$_2$—; —OH; —OR*, —OC(O)CR*; —SR, —SO$_2$N(R*)$_2$; —SO$_2$R*; SOR; —OC(O)R*; —C(O)OR*; —C(O)R*; —Si(OR*)$_3$; —Si(R*)$_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

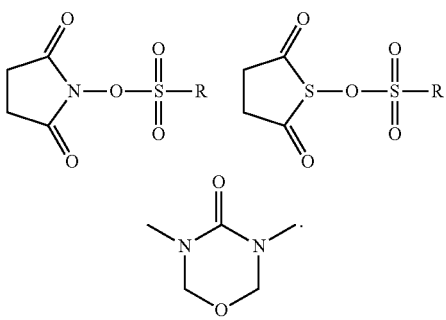

The individual components of the photoresist are placed into a solvent in order to aid in the mixing and dispensing of the photoresist. To aid in the mixing and dispensing of the photoresist, the solvent is chosen at least in part based upon the materials chosen for the polymer as well as the PACs. In some embodiments, the solvent is chosen such that the polymer and the PACs can be evenly dissolved into the solvent and dispensed upon the layer to be patterned.

A photoresist quencher is added to some embodiments of the photoresist composition to inhibit diffusion of the generated acids/bases/free radicals within the photoresist. The photoresist quencher improves the resist pattern configuration as well as the stability of the photoresist over time. In an embodiment, the photoresist quencher is an amine, such as a secondary lower aliphatic amine, a tertiary lower aliphatic amine, or the like. Specific examples of amines include trimethylamine, diethylamine, triethylamine, di-n-propylamine, tri-n-propylamine, tripentylamine, diethanolamine, and triethanolamine, alkanolamine, combinations thereof, or the like.

In some embodiments, an organic acid is used as the photoresist quencher. Specific embodiments of organic acids include malonic acid, citric acid, malic acid, succinic acid, benzoic acid, salicylic acid; phosphorous oxo acid and its derivatives, such as phosphoric acid and derivatives thereof such as its esters, phosphoric acid di-n-butyl ester and phosphoric acid diphenyl ester; phosphonic acid and derivatives thereof such as its ester, such as phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its ester, including phenylphosphinic acid.

Another additive added to some embodiments of the photoresist is a stabilizer, which assists in preventing undesired diffusion of the acids generated during exposure of the photoresist. In some embodiments, the stabilizer includes nitrogenous compounds, including aliphatic primary, secondary, and tertiary amines; cyclic amines, including piperidines, pyrrolidines, morpholines; aromatic heterocycles, including pyridines, pyrimidines, purines; imines, including diazabicycloundecene, guanidines, imides, amides, or the like. Alternatively, ammonium salts are also be used for the stabilizer in some embodiments, including ammonium, primary, secondary, tertiary, and quaternary alkyl- and aryl-ammonium salts of alkoxides, including hydroxide, phenolates, carboxylates, aryl and alkyl sulfonates, sulfonamides, or the like. Other cationic nitrogenous compounds, including pyridinium salts and salts of other heterocyclic nitrogenous compounds with anions, such as alkoxides, including hydroxide, phenolates, carboxylates, aryl and alkyl sulfonates, sulfonamides, or the like, are used in some embodiments.

Another additive in some embodiments of the photoresist is a dissolution inhibitor to help control dissolution of the photoresist during development. In an embodiment bile-salt esters may be utilized as the dissolution inhibitor. Specific examples of dissolution inhibitors in some embodiments include cholic acid, deoxycholic acid, lithocholic acid, t-butyl deoxycholate, t-butyl lithocholate, and t-butyl-3-acetyl lithocholate.

Another additive in some embodiments of the photoresist is a plasticizer. Plasticizers may be used to reduce delamination and cracking between the photoresist and underlying layers (e.g., the layer to be patterned). Plasticizers include monomeric, oligomeric, and polymeric plasticizers, such as oligo- and polyethyleneglycol ethers, cycloaliphatic esters, and non-acid reactive steroidaly-derived materials. Specific examples of materials used for the plasticizer in some embodiments include dioctyl phthalate, didodecyl phthalate, triethylene glycol dicaprylate, dimethyl glycol phthalate, tricresyl phosphate, dioctyl adipate, dibutyl sebacate, triacetyl glycerine, or the like.

A coloring agent is another additive included in some embodiments of the photoresist. The coloring agent helps observers examine the photoresist and find any defects that may need to be remedied prior to further processing. In some embodiments, the coloring agent is a triarylmethane dye or a fine particle organic pigment. Specific examples of materials in some embodiments include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA. (Linebrow), Victoria BO (Linebrow) (C. I. 42595), Victoria Blue BO (C. I. 44045), rhodamine 6G (C. I. 45160), benzophenone compounds, such as 2,4-dihydroxybenzophenone and 2,2', 4,4'-tetrahydroxybenzophenone; salicylic acid compounds, such as phenyl salicylate and 4-t-butylphenyl salicylate; phenylacrylate compounds, such as ethyl-2-cyano-3,3-diphenylacrylate, and 2'-ethylhexyl-2-cyano-3,3-diphenylacrylate; benzotriazole compounds, such as 2-(2-hydroxy-5-methylphenyl)-2H-benzotriazole, and 2-(3-t-butyl-2-hydroxy-5-methylphenyl)-5-chloro-2H-benzotriazole; coumarin compounds, such as 4-methyl-7-diethylamino-1-benzopyran-2-one; thioxanthone compounds, such as diethylthioxanthone; stilbene compounds, naphthalic acid compounds, azo dyes, phthalocyanine blue, phthalocyanine green, iodine green, Victoria blue, crystal violet, titanium oxide, naphthalene black, Photopia methyl violet, bromphenol blue and bromcresol green; laser dyes, such as Rhodamine G6, Coumarin 500, DCM (4-(dicyanomethylene)-2-methyl-6-(4-dimethylaminostyryl)-4H pyran), Kiton Red 620, Pyrromethene 580, or the like. Additionally, one or more coloring agents may be used in combination to provide the desired coloring.

Adhesion additives are added to some embodiments of the photoresist to promote adhesion between the photoresist and an underlying layer upon which the photoresist has been applied (e.g., the layer to be patterned). In some embodiments, the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, an organophosphorus compound, 8-oxyquinoline, 4-hydroxypteridine and derivatives, 1,10-phenanthroline and derivatives, 2,2'-bipyridine and derivatives, benzotriazoles, organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations thereof, or the like.

Surface leveling agents are added to some embodiments of the photoresist to assist a top surface of the photoresist to be level, so that impinging light will not be adversely modified by an unlevel surface. In some embodiments, surface leveling agents include fluoroaliphatic esters, hydroxyl terminated fluorinated polyethers, fluorinated ethylene glycol polymers, silicones, acrylic polymer leveling agents, combinations thereof, or the like.

In some embodiments, the polymer and the PACs, along with any desired additives or other agents, are added to the solvent for application. Once added, the mixture is then mixed in order to achieve a homogenous composition throughout the photoresist to ensure that there are no defects caused by uneven mixing or nonhomogenous composition of the photoresist. Once mixed together, the photoresist may either be stored prior to its usage or used immediately.

In some embodiments, the protective layer 20 includes a polymer, a solvent, and a basic quencher, an organic acid, a photoacid generator, or a thermal acid generator. In some embodiments the basic quencher is an amine compound, a thermal base generator (TBG), or a photo base generator (PBG). In some embodiments, the polymer does not include a nitrogen-containing moiety. In some embodiments, the polymer is selected from the group consisting of a polyacrylate, a polymethylmethacrylate, a polyfluoroalcohol, a polyester, a polyimide, a polyether, and a polyalcohol. The polymer is soluble in a TMAH developer (e.g. ~2.38% TMAH) in some embodiments. In some embodiments, the polymer does not contain acid labile groups. In some embodiments, the polymer does not contain functional groups that are cleaved by a base. In some embodiments, the protective layer 20 is not a photoresist layer. In some embodiments, the developer 57 removes both the portions of the protective layer 20 exposed to actinic radiation 45 and the portions of the protective layer 20 that was not exposed to actinic radiation 45, unlike the photoresist layer 15 where either the exposed 50 or unexposed 52 portions are removed by the developer 57.

In some embodiments, the solvent for the protective layer 20 is an alcohol, ether, or an ester that does not dissolve the photoresist during the protective layer coating operation.

In some embodiments, the basic quencher is a photo decomposable quencher (PDQ). In some embodiments, the PDQ is the same material as the PBG. During actinic radiation exposure or post-exposure baking, the base that is generated in the protective layer 20 diffuses from the protective layer 20 into the unexposed areas of the photoresist 15 and neutralizes any acid that diffused into unexposed areas or neutralizes any acid generated in the unexposed areas as a result of light leakage, as shown in FIGS. 7A and 7B. Therefore, the protective layer 20 of the disclosed embodiments, prevents pattern degradation and deformation.

In some embodiments, the thermal base generator (TBG) is one or more selected from the group consisting of:

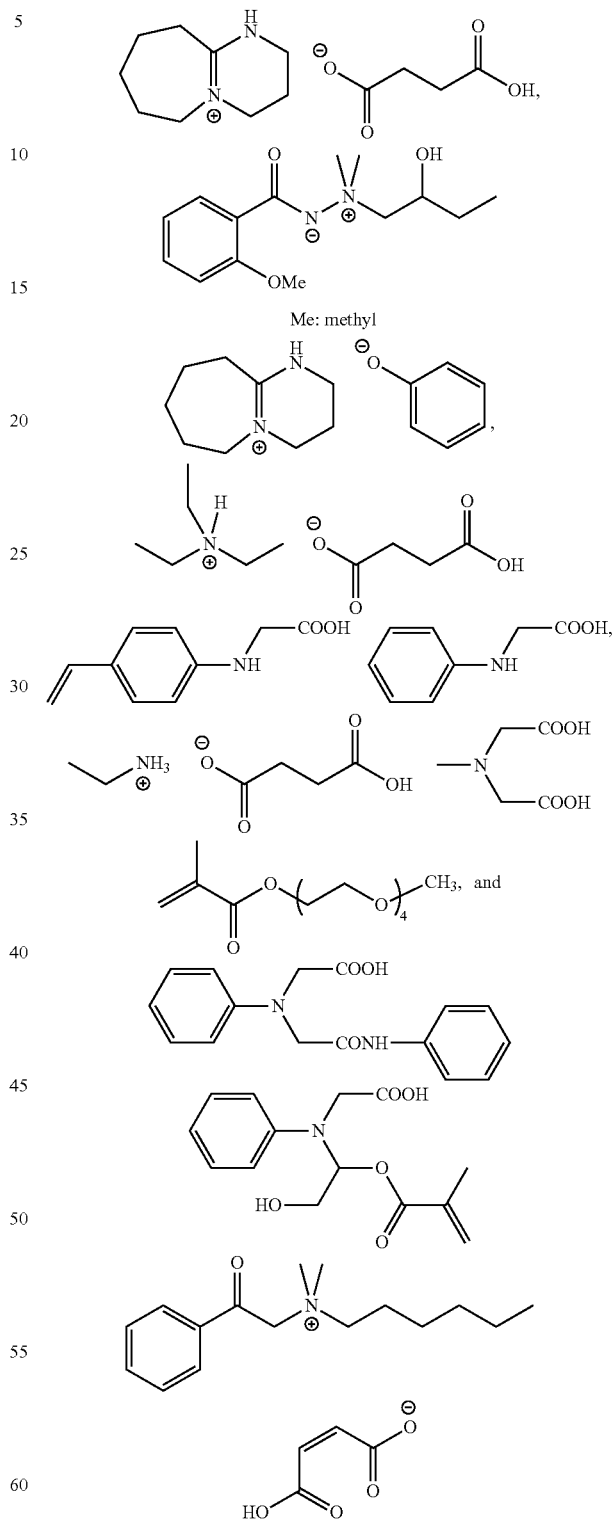

In some embodiments, the thermal base generator (TBG) is N-(p-nitrophenyl)-2,6-dimethylpiperidine (NDP).

In some embodiments, the basic quencher diffuses from the protective layer 20 into the photoresist layer 15 and inhibits diffusion of the generated acids/bases/free radicals within the photoresist, thereby improving the resist pattern configuration. In an embodiment, the basic quencher is an amine, such as a secondary lower aliphatic amine, a tertiary lower aliphatic amine, or the like. Specific examples of amine basic quenchers include trimethylamine, diethylamine, triethylamine, di-n-propylamine, tri-n-propylamine, tripentylamine, diethanolamine, and triethanolamine, alkanolamine, combinations thereof, or the like.

In some embodiments, the basic quencher has the formula:

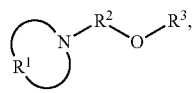

where $R^3$ includes a fluorine atom or alkyl fluoride. In an embodiment, the $R^3$ includes an alkyl fluoride $C_xF_y$, where x is between 1 and 10. In an embodiment, the alkyl fluoride may include $CF_3$, $C_2F_5$, $C_3F_7$, and/or other suitable groups. $R^3$ may be an alkyl group having a plurality of carbon atoms (e.g., x between of 1 to 10) with a straight, branched or cyclic structure. The alkyl group may also include a heteroatom, such as nitrogen or oxygen. In some embodiments, $R^1$ is an alicyclic group of 5 or more carbon atoms, which may have a substituent. In some embodiments, $R^2$ is a substituted or unsubstituted C1-C12 alkyl, C1-C12 aryl, C1-C12 aralkyl, or the like.

In another embodiment, the basic quencher has the formula:

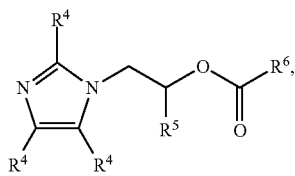

where $R^4$, $R^5$, or $R^6$ include a fluorine atom or alkyl group. $R^4$, $R^5$, or $R^5$ may be a C1-C10 alkyl group having a straight, branched, or cyclic structure. In an embodiment, $R^4$, $R^5$, or $R^5$ include an alkyl fluoride, $C_xF_y$, where x is between 1 and 10, and y is 2x+1. In some embodiments, the alkyl fluoride includes $CF_3$, $C_2F_5$, $C_3F_7$, or other suitable groups. The alkyl group may also include a heteroatom, such as nitrogen or oxygen.

In another embodiment, the basic quencher has the formula:

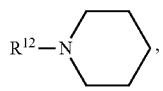

where $R^{12}$ includes a fluorine atom or an alkyl group. In some embodiments, $R^{12}$ is a C1-C10 alkyl group having a straight, branched, or cyclic structure. In an embodiment, $R^{12}$ include an alkyl fluoride, $C_xF_y$, where x is between 1 and 10, and y is 2x+1. In some embodiments, the alkyl fluoride includes $CF_3$, $C_2F_5$, $C_3F_7$, or other suitable groups.

In another embodiment, the basic quencher has the formula:

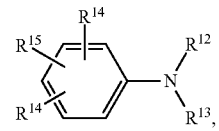

where at least one of $R^{12}$, $R^{13}$, $R^{14}$, and $R^{15}$ includes a fluorine atom or an alkyl fluoride. At least one of $R^{12}$, $R^{13}$, $R^{14}$, and $R^{15}$ is a C1-C10 alkyl group having a straight, branched, or cyclic structure. In an embodiment, at least one of $R^{12}$, $R^{13}$, $R^{14}$, and $R^{15}$ includes an alkyl fluoride. In some embodiments, the alkyl fluoride includes $CF_3$, $C_2F_5$, $C_3F_7$, or other suitable groups.

In another embodiment, the basic quencher has the formula:

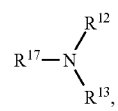

where at least one of $R^{12}$, $R^{13}$, $R^{17}$ includes a fluorine atom or an alkyl fluoride. At least one of $R^{12}$, $R^{13}$, and $R^{17}$ is a C1-C10 alkyl group having a straight, branched, or cyclic structure. In an embodiment, at least one of $R^{12}$, $R^{13}$, $R^{14}$, and $R^{15}$ includes an alkyl fluoride. In some embodiments, the alkyl fluoride includes $CF_3$, $C_2F_5$, $C_3F_7$, or other suitable groups.

Some embodiments of basic quenchers include:

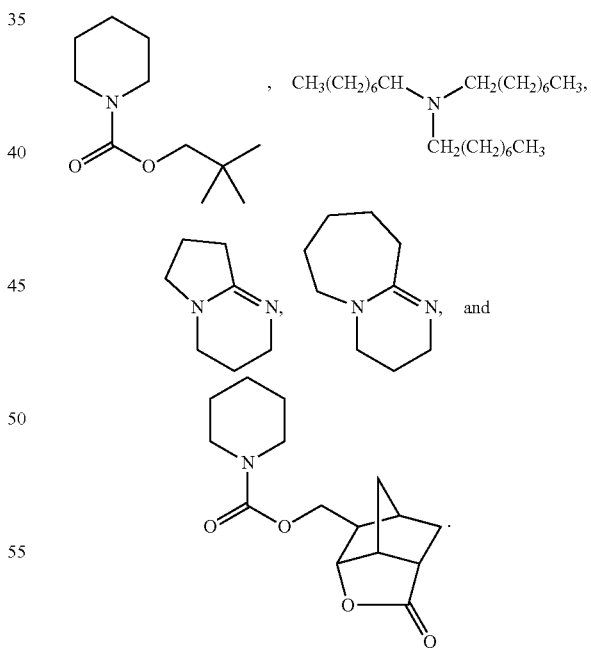

In some embodiments, the quencher is a photo decomposable base (PDB). Examples of photo decomposable bases are shown in FIG. 17, where $R^1$ is a substituted or unsubstituted C5-C18 alicyclic group, X is a divalent linking group, Y is a linear, branched, or cyclic C2-C18 alkylene group or C6-C18 arylene group, Rf is a C1-C5 fluorocarbon group, and M is an organic cation or a metal cation.

The basic quencher is included in the protective layer 20 at a concentration ranging from about 0.1 wt. % to about 10 wt. % relative to the weight of the quencher and the polymer. At concentrations below about 0.1 wt. % there may not be a sufficient amount of the basic quencher to provide the desired effect. At concentrations of the basic quencher greater than about 10 wt. % no substantial improvement in the photoresist pattern profile may be obtained.

As shown in FIG. 7B, after developing, patterns 55a defined by the unexposed portions 52 of the photoresist layer with sharp, well-defined boundaries are provided, as a result of the protective layer 20. The protective layer 20 prevents the formation of rounded pattern features. The photoresist layer 15 is a positive tone photoresist in the embodiment of FIGS. 7A and 7B.

Figure 8B:
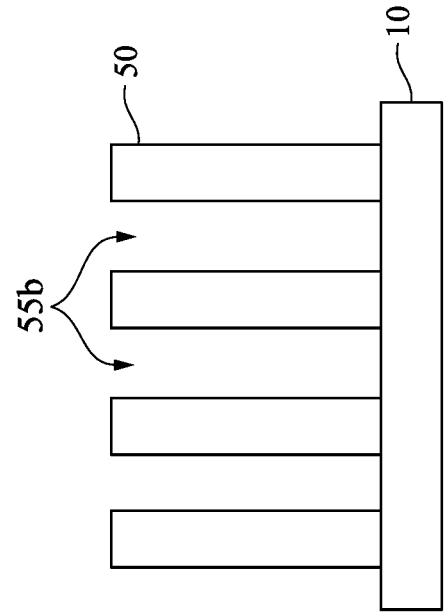
FIGS. 8A and 8B show process stages of a sequential operation according to an embodiment of the disclosure.
Figure 8A:
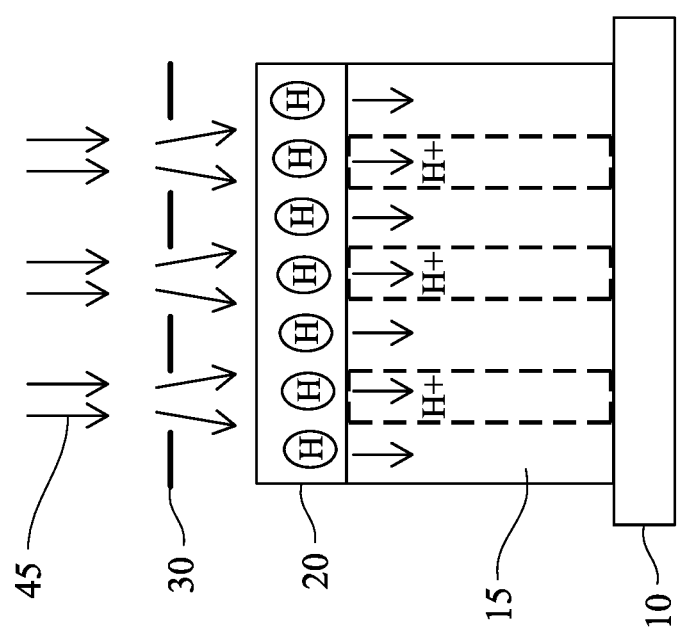

As shown in FIGS. 8A and 8B, in some embodiments, an acid, a photoacid generator (PAG), or thermal acid generator (TAG) is included in the protective layer 20 disposed over a negative tone photoresist layer 15. In some embodiments, the acid is an organic acid. Specific embodiments of organic acids include malonic acid, citric acid, malic acid, succinic acid, benzoic acid, salicylic acid; phosphorous oxo acid and its derivatives, such as phosphoric acid and derivatives thereof such as its esters, phosphoric acid di-n-butyl ester and phosphoric acid diphenyl ester; phosphonic acid and derivatives thereof such as its ester, such as phosphonic acid dimethyl ester, phosphonic acid di-n-butyl ester, phenylphosphonic acid, phosphonic acid diphenyl ester, and phosphonic acid dibenzyl ester; phosphinic acid and derivatives thereof such as its esters, including phenylphosphinic acid; and sulfonic acids.

In some embodiments, the thermal acid generator (TAG) is one or more selected from the group consisting of

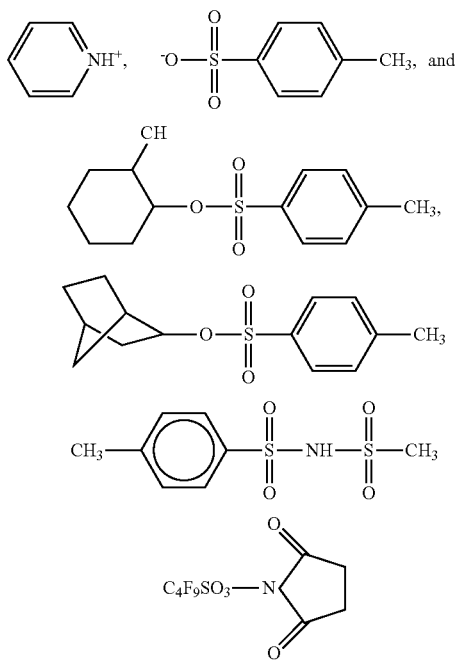

FIG. 6

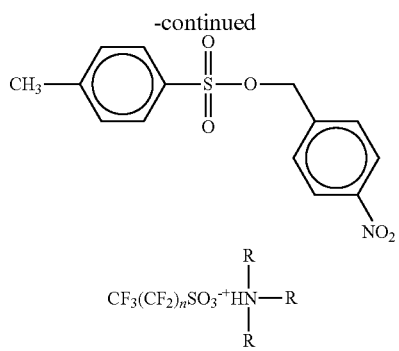

where 0≤n≤10, and R is hydrogen or a substituted or unsubstituted C1-C10 alkyl group. In some embodiments, the thermal acid generator is selected from $NH_4^+C_4F_9SO_3^-$ and $NH_4^+CF_3SO_3^-$.

As with the embodiment of FIGS. 7A and 7B, the polymer is selected from the group consisting of a polyacrylate, a polymethylmethacrylate, a polyfluoroalcohol, a polyester, a polyimide, a polyether, and a polyalcohol. In some embodiments, the polymer does include a nitrogen-containing moiety. In some embodiments, the polymer is soluble in a TMAH developer (e.g. −2.38% TMAH). In some embodiments, the polymer does not contain acid labile groups. In some embodiments, the polymer does not contain functional groups that are cleaved by a base. In addition, in some embodiments, the solvent for the protective layer is an alcohol, ether, or an ester that does not dissolve the photoresist during the protective layer coating operation.

The photoacid generator (PAG) can be any one of the photoacid generators discussed herein in reference to the photoresist composition.

The organic acid, PAG, or TAG is included in the protective layer at a concentration ranging from about 0.1 wt. % to about 10 wt. % relative to the weight of the organic acid, PAG, or TAG, and the polymer. At concentrations below about 0.1 wt. % there may not be a sufficient amount of the acid, PAG, or TAG to provide the desired effect. At concentrations of the acid, PAG, or TAG greater than about 10 wt. % no substantial improvement in the photoresist pattern profile may be obtained.

As shown in FIG. 8B, after developing, patterns 55b defined by the exposed portions of the photoresist layer 50 with sharp, well-defined boundaries are provided, as a result of the protective layer 20. The protective layer 20 prevents the formation of rounded pattern features.

Figure 9B:
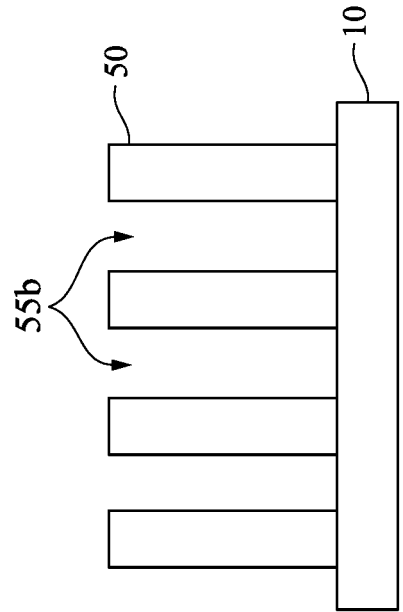
FIGS. 9A and 9B show process stages of a sequential operation according to an embodiment of the disclosure.
Figure 9A:
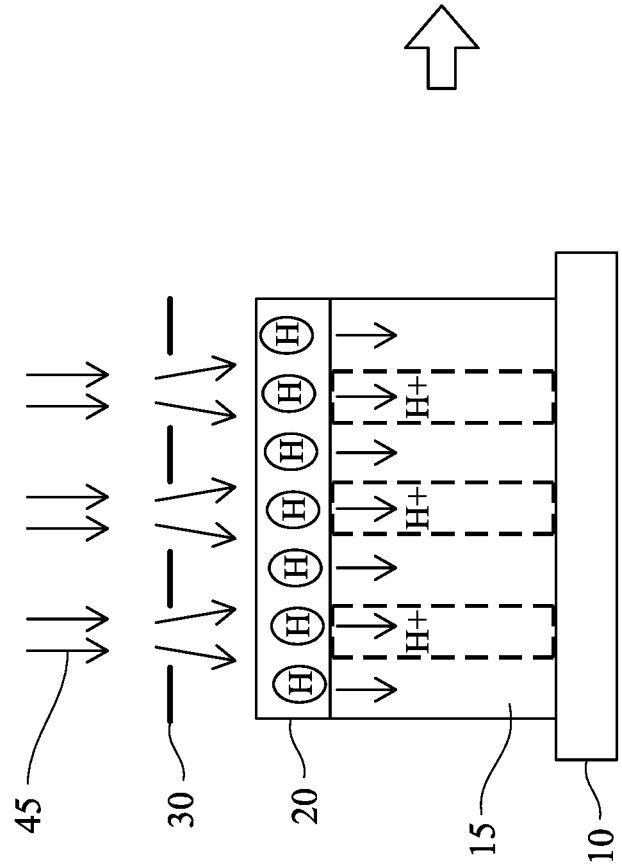

As shown in FIGS. 9A and 9B, in some embodiments, where a negative tone development photoresist (NTD PR) is used, the protective layer 20 includes a polymer, and an acid, a photoacid generator (PAG), or thermal acid generator (TAG). In some embodiments, the polymer does not include a nitrogen-containing moiety. The negative tone developer uses n-butyl acetate (NBA) as a developer solvent. In some embodiments, the acid, PAG, and TAG are the same as those used in the embodiment of FIGS. 8A and 8B.

Likewise, the polymer is any of the polymers disclosed in reference to FIGS. 7A, 7B, 8A, and 8B which can be dissolved by NBA, and the solvent can be any of the previously disclosed solvents that does not dissolve the photoresist layer.

The organic acid, PAG, or TAG is included in the protective layer of the embodiment of FIG. 9A at a concentration ranging from about 0.1 wt. % to about 10 wt. % relative to the weight of the organic acid, PAG, or TAG, and the polymer. At concentrations below about 0.1 wt. % there may not be a sufficient amount of the acid, PAG, or TAG to provide the desired effect. At concentrations of the acid, PAG, or TAG greater than about 10 wt. % substantial improvement in the photoresist pattern profile may not be obtained.

As shown in FIG. 9B, after developing using the NBA developer, patterns 55b defined by the exposed portions of the photoresist layer 50 with sharp, well-defined boundaries are provided, as a result of the protective layer 20. The protective layer 20 prevents the formation of rounded pattern features.

Referring back to FIGS. 2A-2D, once the photoresist is prepared, the photoresist is applied onto the layer to be patterned, as shown in FIG. 2A, such as the substrate 10 to form a photoresist layer 15. In some embodiments, the photoresist is applied using a process such as a spin-on coating process, a dip coating method, an air-knife coating method, a curtain coating method, a wire-bar coating method, a gravure coating method, a lamination method, an extrusion coating method, combinations of these, or the like. In some embodiments, the photoresist layer 15 thickness ranges from about 10 nm to about 300 nm.

After the photoresist layer 15 has been applied to the substrate 10, a pre-bake of the photoresist layer is performed in some embodiments to cure and dry the photoresist prior to radiation exposure (see FIG. 2B). The curing and drying of the photoresist layer 15 removes the solvent component while leaving behind the polymer, the PACs, and other chosen additives, such as a cross-linking agent. In some embodiments, the pre-baking is performed at a temperature suitable to evaporate the solvent, such as between about 50° C. and 120° C., although the precise temperature depends upon the materials chosen for the photoresist. The pre-baking is performed for a time sufficient to cure and dry the photoresist layer, such as between about 10 seconds to about 10 minutes. Next, the protective layer 20 is applied over the dried photoresist layer 20 (FIG. 2C), and the protective layer 20 is subsequently baked for a sufficient time to cure and dry the protective layer in FIG. 2D.

FIGS. 3A and 3B illustrate selective exposures of the photoresist layer 15 to form an exposed region 50 and an unexposed region 52. In some embodiments, the exposure to radiation is carried out by placing the photoresist-coated substrate in a photolithography tool. The photolithography tool includes a photomask 30/65, optics, an exposure radiation source to provide the radiation 45/97 for exposure, and a movable stage for supporting and moving the substrate under the exposure radiation.

In some embodiments, the radiation source (not shown) supplies radiation 45/97, such as ultraviolet light, to the photoresist layer 15 in order to induce a reaction of the PACs, which in turn reacts with the polymer to chemically alter those regions of the photoresist layer to which the radiation 45/97 impinges. In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

In some embodiments, optics (not shown) are used in the photolithography tool to expand, reflect, or otherwise control the radiation before or after the radiation 45/97 is patterned by the photomask 30/65. In some embodiments, the optics include one or more lenses, mirrors, filters, and combinations thereof to control the radiation 45/97 along its path.

In an embodiment, the patterned radiation 45/97 is extreme ultraviolet light having a 13.5 nm wavelength, the PAC is a photoacid generator, the group to be decomposed is a carboxylic acid group on the hydrocarbon structure, and a cross linking agent is used. The patterned radiation 45/97 impinges upon the photoacid generator, and the photoacid generator absorbs the impinging patterned radiation 45/97. This absorption initiates the photoacid generator to generate a proton (e.g., a $H^+$ atom) within the photoresist layer 15. When the proton impacts the carboxylic acid group on the hydrocarbon structure, the proton reacts with the carboxylic acid group, chemically altering the carboxylic acid group and altering the properties of the polymer in general. The carboxylic acid group then reacts with the cross-linking agent in some embodiments to cross-link with other polymers within the exposed region of the photoresist layer 15. In other embodiments, an acid labile group (ALG) on the polymer is decomposed by the action of the acid generated by the photoacid generator leaving a carboxylic acid group pendant to the polymer chain. The resulting carboxylic acid group renders the polymer more soluble in a developer in the case of positive tone resists.

In some embodiments, the exposure of the photoresist layer 15 uses an immersion lithography technique. In such a technique, an immersion medium (not shown) is placed between the final optics and the photoresist layer, and the exposure radiation 45 passes through the immersion medium.

After the protective layer 20 and the photoresist layer 15 have been exposed to the exposure radiation 45, a post-exposure baking is performed in some embodiments to assist in the generating, dispersing, and reacting of the acid/base/free radical generated from the impingement of the radiation 45 upon the PACs during the exposure. Such thermal assistance helps to create or enhance chemical reactions which generate chemical differences between the exposed region 50 and the unexposed region 52 within the photoresist layer 15. These chemical differences also cause differences in the solubility between the exposed region 50 and the unexposed region 52. In some embodiments, the post-exposure baking occurs at temperatures ranging from about 50° C. to about 160° C. for a period of between about 20 seconds and about 120 seconds.

The inclusion of the cross-linking agent into the chemical reactions in some embodiments, helps the components of the polymer (e.g., the individual polymers) react and bond with each other, increasing the molecular weight of the bonded polymer. In particular, an initial polymer has a side chain with a carboxylic acid protected by one of the groups to be removed/acid labile groups. The groups to be removed are removed in a de-protecting reaction, which is initiated by a proton $H^+$ generated by, e.g., the photoacid generator during either the exposure process or during the post-exposure baking process. The $H^+$ first removes the groups to be removed/acid labile groups and another hydrogen atom may replace the removed structure to form a de-protected polymer. Once de-protected, a cross-linking reaction occurs between two separate de-protected polymers that have undergone the de-protecting reaction and the cross-linking agent in a cross-linking reaction. In particular, hydrogen atoms within the carboxylic groups formed by the de-protecting reaction are removed and the oxygen atoms react with and bond with the cross-linking agent. This bonding of the cross-linking agent to two polymers bonds the two polymers not only to the cross-linking agent but also bonds the two polymers to each other through the cross-linking agent, thereby forming a cross-linked polymer.

By increasing the molecular weight of the polymers through the cross-linking reaction, the new cross-linked polymer becomes less soluble in conventional organic solvent negative tone resist developers. In other embodiments, the photoresist layer 15 is a positive tone resist, and the exposed areas of the photoresist become more soluble in the developer.

In some embodiments, the photoresist developer 57 includes a solvent, and an acid or a base. In some embodiments, the concentration of the solvent is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer.

In some embodiments, the developer 57 is applied to the protective layer 20 and the photoresist layer 15 using a spin-on process. In the spin-on process, the developer 57 is applied to the protective layer 20 and the photoresist layer 15 from above while the photoresist-coated substrate is rotated, as shown in FIG. 4. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments, and the development operation removes the protective layer along with the exposed portion of the photoresist in some embodiments.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

During the development process, the developer 57 dissolves the radiation-exposed regions 50 of the positive tone resist, exposing the surface of the substrate 10, as shown in FIG. 5A, and leaving behind well-defined unexposed photoresist regions 52, having improved definition than provided by conventional positive photoresist photolithography. In other embodiments, the developer 57 dissolves the regions 52 of the negative tone resist that were not exposed to actinic radiation, exposing the surface of the substrate 10, as shown in FIG. 5B.

After the developing operation S150, remaining developer is removed from the patterned photoresist covered substrate. The remaining developer is removed using a spin-dry process in some embodiments, although any suitable removal technique may be used. After the photoresist layer 15 is developed, and the remaining developer is removed, additional processing is performed while the patterned photoresist layer 50 is in place. For example, an etching operation, using dry or wet etching, is performed in some embodiments, to transfer the pattern 55a, 55b of the photoresist layer 50 to the underlying substrate 10, forming recesses 55a' and 55b', as shown in FIGS. 6A and 6B, respectively. The substrate 10 has a different etch resistance than the photoresist layer 15. In some embodiments, the etchant is more selective to the substrate 10 than the photoresist layer 15.

In some embodiments, the substrate 10 and the photoresist layer 15 contain at least one etching resistance molecule. In some embodiments, the etching resistant molecule includes a molecule having a low Onishi number structure, a double bond, a triple bond, silicon, silicon nitride, titanium, titanium nitride, aluminum, aluminum oxide, silicon oxynitride, combinations thereof, or the like.

Figure 10:
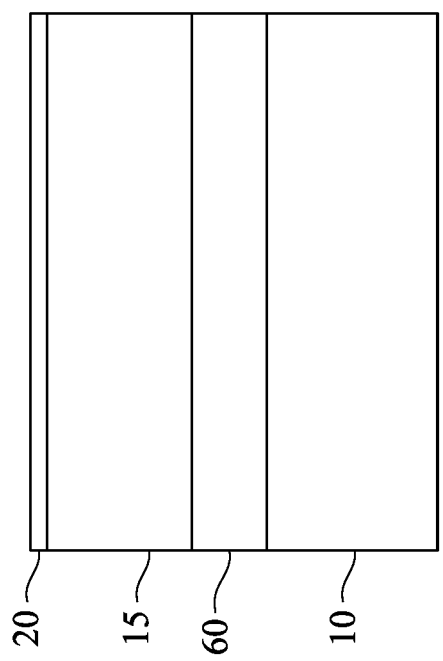
FIG. 10 shows a process stage of a sequential operation according to an embodiment of the disclosure.

In some embodiments, a layer to be patterned 60 is disposed over the substrate prior to forming the photoresist layer, as shown in FIG. 10. In some embodiments, the layer to be patterned 60 is a metallization layer or a dielectric layer, such as a passivation layer, disposed over a metallization layer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

Figure 11A:
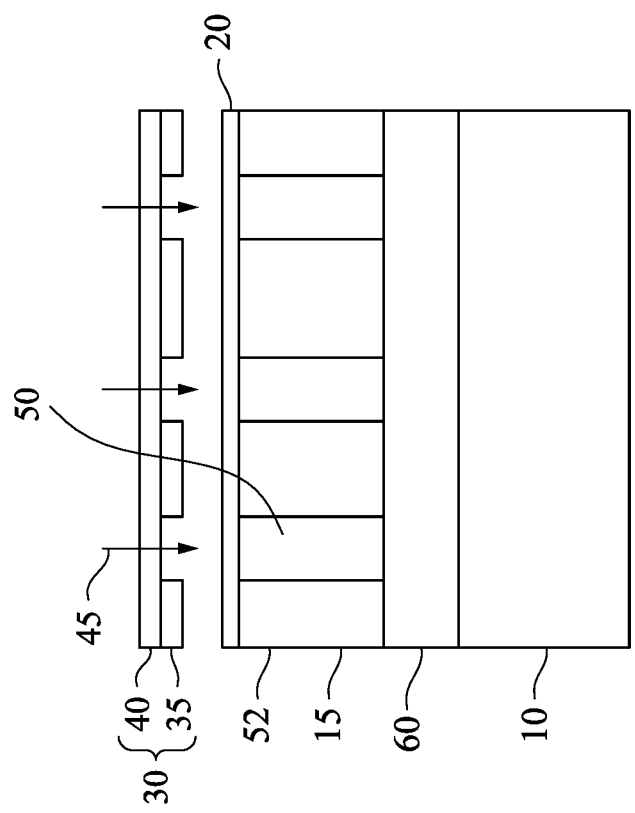
FIGS. 11A and 11B show process stages of a sequential operation according to an embodiment of the disclosure.
Figure 11B:
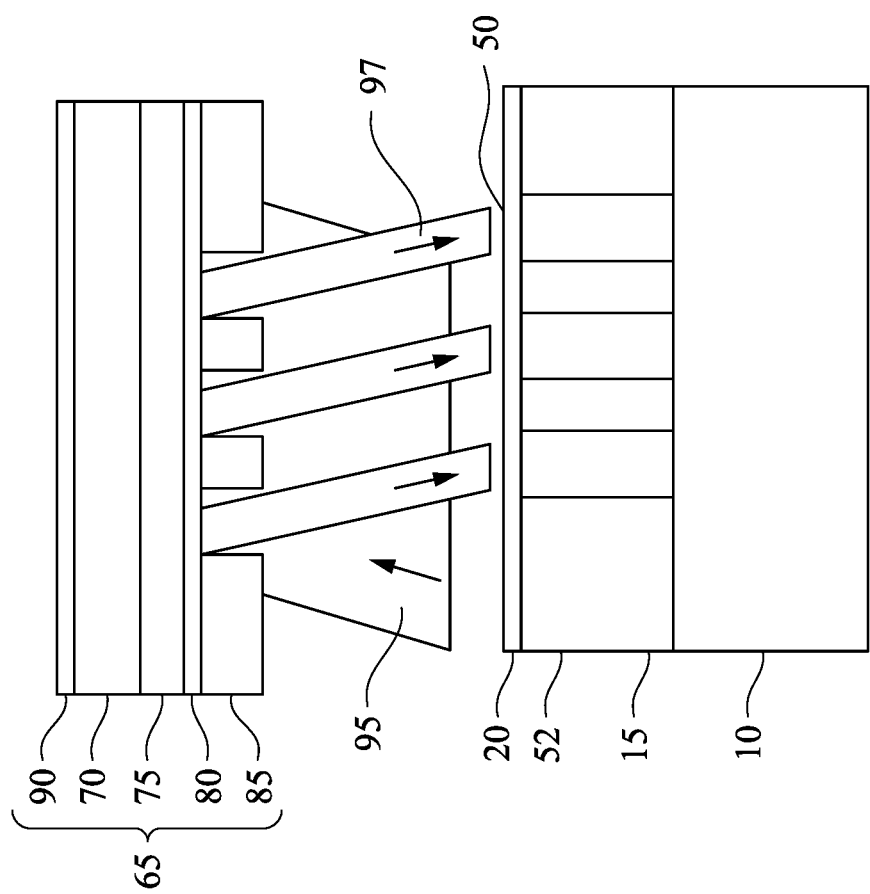

The photoresist layer 15 is subsequently selectively exposed to actinic radiation 45 to form exposed regions 50 and unexposed regions 52 in the photoresist layer, as shown in FIGS. 11A and 11B, and described herein in relation to FIGS. 3A and 3B. As explained herein the photoresist is a negative tone resist, wherein polymer crosslinking occurs in the exposed regions 50 in some embodiments. In other embodiments, the photoresist is a positive tone resist, wherein a decomposition reaction occurs in the exposed regions 50 making the exposed regions more soluble in the developer.

Figure 12:
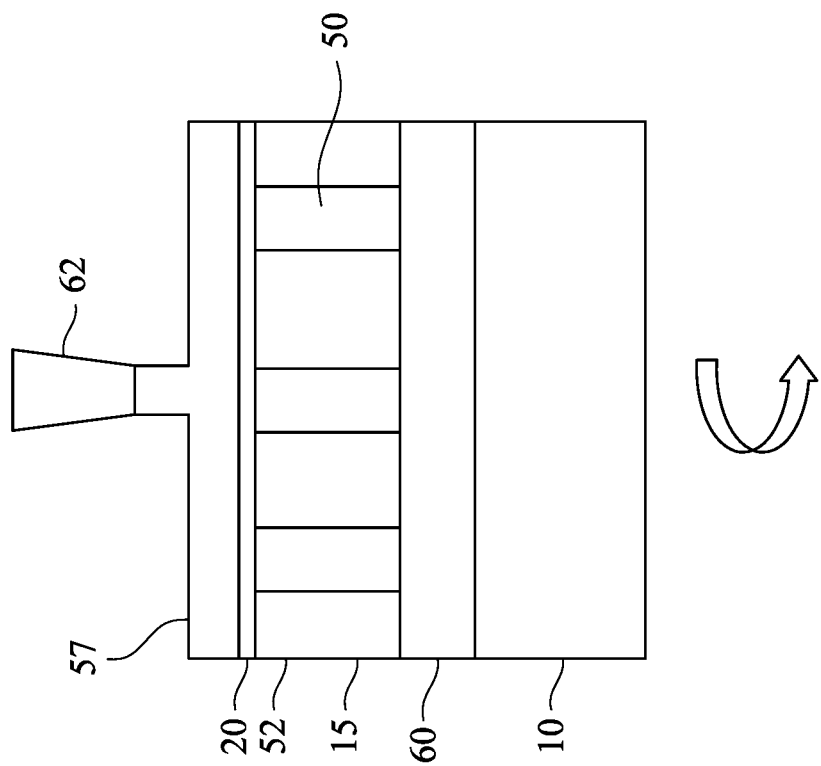
FIG. 12 shows a process stage of a sequential operation according to an embodiment of the disclosure.
Figure 13A:
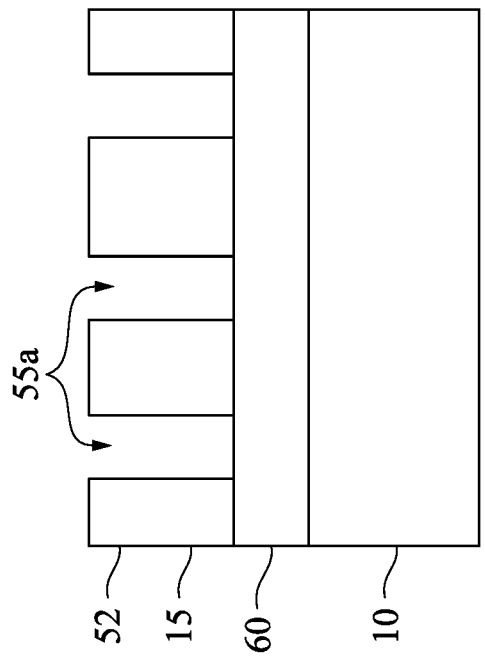
FIGS. 13A and 13B show process stages of a sequential operation according to an embodiment of the disclosure.
Figure 13B:
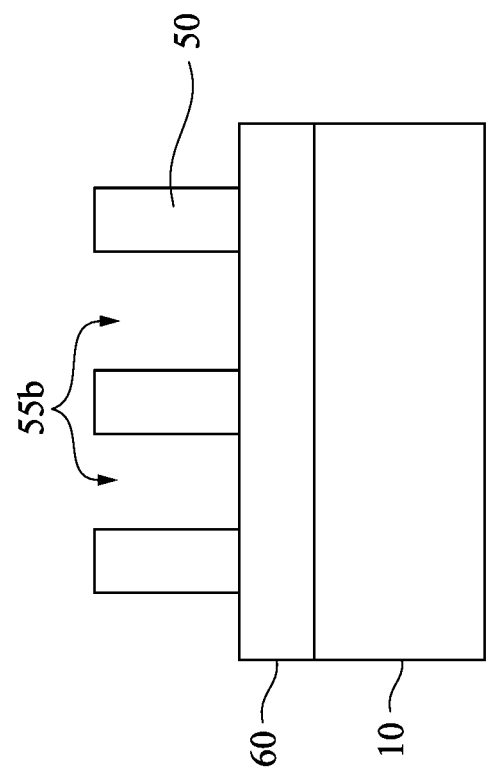

As shown in FIG. 12, the selectively exposed photoresist layer 15 is developed by dispensing developer 57 from a dispenser 62 to form a pattern of recesses 55a in a positive tone resist, as shown in FIG. 13A, or a pattern of recesses 55b in a negative tone resist, as shown in FIG. 13B. The development operation is similar to that explained with reference to FIGS. 4, 5A, and 5B, herein.

Figure 14A:
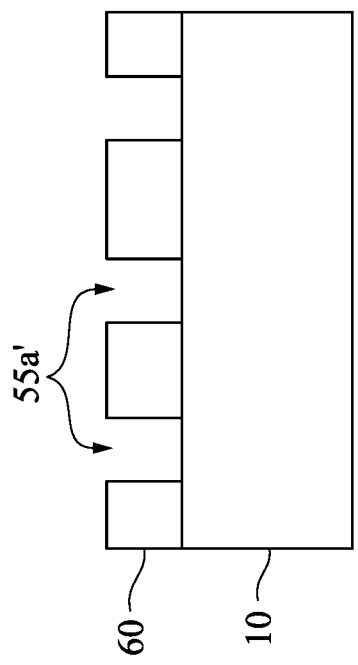
FIGS. 14A and 14B show process stages of a sequential operation according to an embodiment of the disclosure.
Figure 14B:
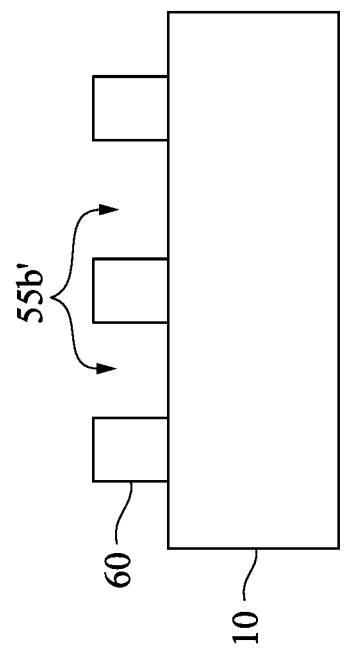

Then as shown in FIGS. 14A and 14B, the patterns 55a, 55b in the photoresist layers 15 are transferred to the layer to be patterned 60 using etching operations and the photoresist layer is removed, as explained with reference to FIGS. 6A and 6B to form patterns 55a' and 55b', respectively, in the layers to be patterned 60.

Other embodiments include other operations before, during, or after the operations described above. In some embodiments, the disclosed methods include forming fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof are formed, according to embodiments of the disclosure.

The novel protective layer and photolithographic patterning methods according to the present disclosure provide higher semiconductor device feature resolution and density at higher wafer exposure throughput with reduced defects in a higher efficiency process than conventional exposure techniques. Embodiments according to the present disclosure provide improved critical dimension variation and reduces defects. The novel protective layer prevents photoresist pattern degradation, deformation, and photoresist pattern loss. Semiconductor devices formed according to the present disclosure have improved critical dimension stability control.

An embodiment of the disclosure is a method of forming a photoresist pattern, including forming a protective layer over a photoresist layer formed on a substrate. The protective layer and the photoresist layer are selectively exposed to actinic radiation. The photoresist layer is developed to form a pattern in the photoresist layer. The protective layer includes a polymer without a nitrogen-containing moiety, and a basic quencher, an organic acid, a photoacid generator, or a thermal acid generator. In an embodiment, the basic quencher is a secondary or tertiary amine, a photobase generator, or a thermal base generator. In an embodiment, the photobase generator is one or more selected from the group consisting of quaternary ammonium dithiocarbamates, a aminoketones, oxime-urethane containing molecules, dibenzophenoneoxime hexamethylene diurethan, ammonium tetraorganylborate salts, and N-(2-nitrobenzyloxycarbonyl) cyclic amines, and combinations thereof. In an embodiment, the thermal base generator is one or more selected from the group consisting of:

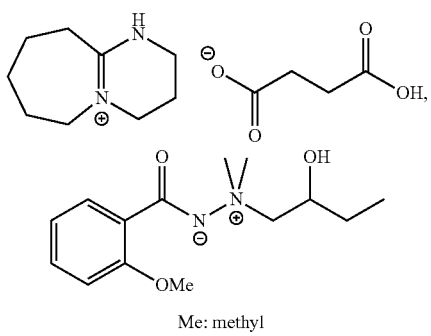

Me: methyl

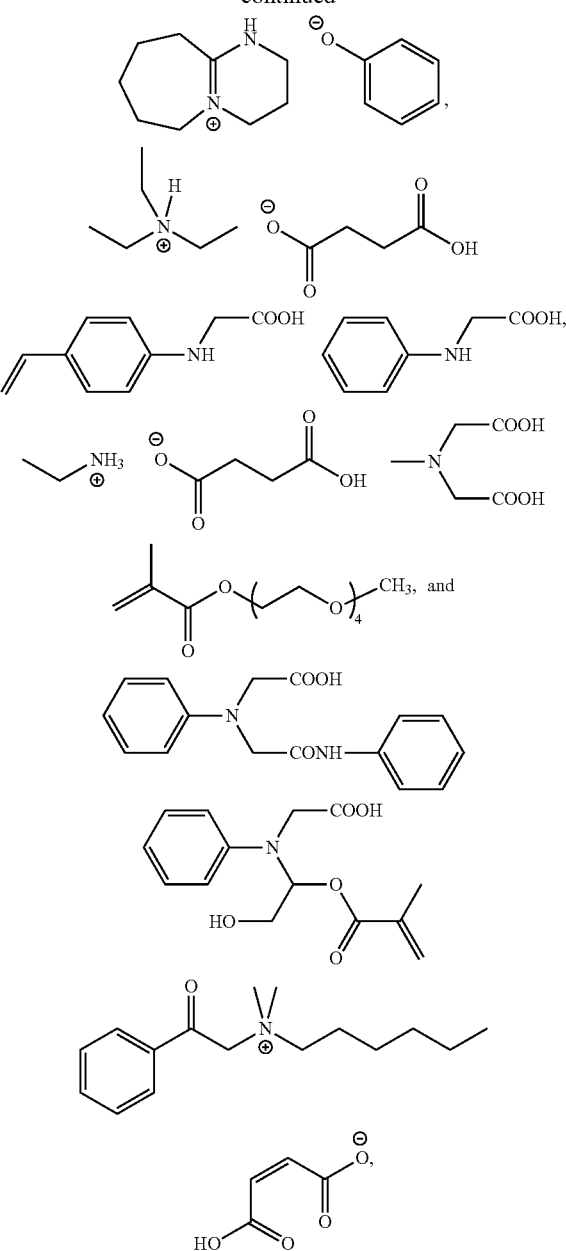

In an embodiment, the thermal base generator is N-(p-nitrophenyl)-2,6-dimethylpiperidine. In an embodiment, the thermal acid generator is one or more selected from the group consisting of

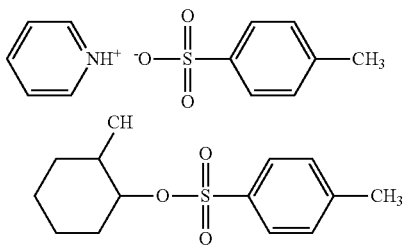

FIG. 6

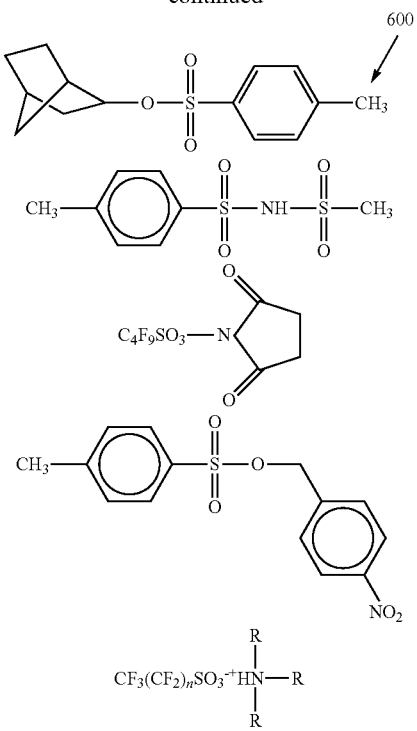

where 0≤n≤10, and R is hydrogen or a substituted or unsubstituted C1-C10 alkyl group. In an embodiment, the thermal acid generator is $NH_4^+C_4F_9SO_3^-$ or $NH_4^+CF_3SO_3^-$. In an embodiment, a concentration of the basic quencher, organic acid, photoacid generator, or thermal acid generator in the protective layer ranges from 0.1 wt. % to 10 wt. % based on a weight of the polymer and the basic quencher, organic acid, photoacid generator, or thermal acid generator. In an embodiment, the polymer without a nitrogen-containing moiety is selected from the group consisting of a polyacrylate, a polymethylmethacrylate, a polyfluoroalcohol, a polyester, a polyimide, a polyether, and a polyalcohol. In an embodiment, the polymer does not include acid labile groups.

Another embodiment of the disclosure is a method of forming a photoresist pattern, including forming a photoresist layer including a photoresist composition over a substrate. A protective layer including a basic quencher is formed over the photoresist layer. A latent pattern is formed in the photoresist layer by selectively exposing the photoresist layer to actinic radiation. A base is generated in the protective layer or base in the protective layer is diffused into the photoresist layer. The protective layer is removed, and the photoresist layer is developed to form a pattern in the photoresist layer. In an embodiment, portions of the photoresist layer exposed to the actinic radiation are removed during the developing the photoresist layer. In an embodiment, the base generated in the protective layer is generated by exposing the protective layer to the actinic radiation. In an embodiment, the base generated in the protective layer is generated by heating the protective layer. In an embodiment, the base is diffused from the protective layer into the photoresist layer by heating the protective layer and the photoresist layer. In an embodiment, the basic quencher is a secondary or tertiary amine, a photobase generator, or a thermal base generator. In an embodiment, the protective layer includes one or more photobase generators selected from the group consisting of quaternary ammonium dithiocarbamates, a aminoketones, oxime-urethane containing molecules, dibenzophenoneoxime hexamethylene diurethan, ammonium tetraorganylborate salts, and N-(2-nitrobenzyloxycarbonyl) cyclic amines, and combinations thereof. In an embodiment, the protective layer includes one or more photobase generators having a formula: $R^1$—X—Y—$N^-$—($SO_2$)—Rf-$M^+$, where $R^1$ is a substituted or unsubstituted C5-C18 alicyclic group, X is a divalent linking group, Y is a linear, branched, or cyclic C2-C18 alkylene group or C6-C18 arylene group, Rf is a C1-C5 fluorocarbon group, and M is an organic cation or a metal cation. In an embodiment, the basic quencher is one or more thermal base generators selected from the group consisting of:

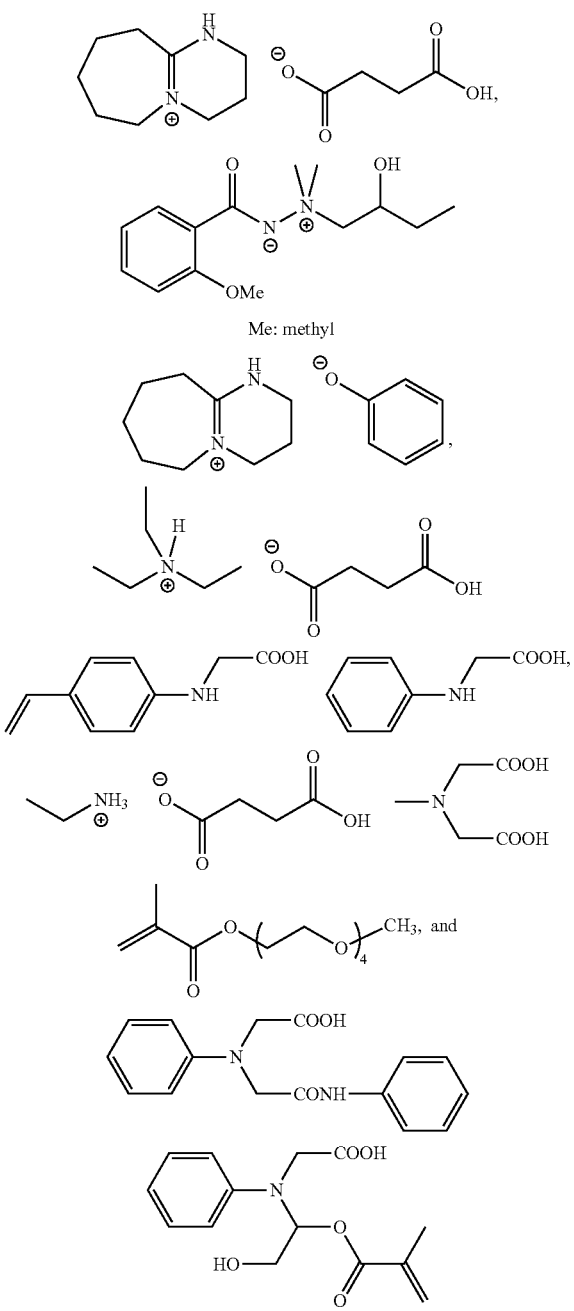

-continued

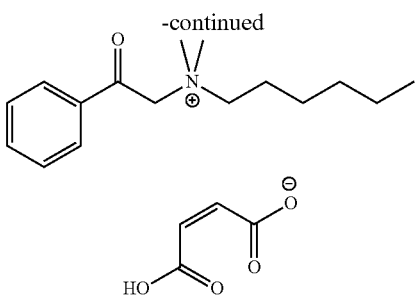

In an embodiment, the basic quencher is N-(p-nitrophenyl)-2,6-dimethylpiperidine. In an embodiment, the protective layer is not a photoresist. In an embodiment, the photoresist layer is a positive tone photoresist layer. In an embodiment, the protective layer includes a polymer selected from the group consisting of a polyacrylate, a polymethylmethacrylate, a polyfluoroalcohol, a polyester, a polyimide, a polyether, and a polyalcohol. In an embodiment, the polymer does not contain acid labile groups. In an embodiment, the method includes heating the photoresist layer and protective layer at a temperature ranging from 40° C. to 120° C. after forming the protective layer. In an embodiment, the method includes heating the photoresist layer and protective layer at a temperature ranging from 50° C. to 150° C. after selectively exposing the photoresist layer.

Another embodiment of the disclosure is a method of forming a photoresist pattern, including forming a photoresist layer including a photoresist composition over a substrate. A protective layer including a polymer without a nitrogen-containing moiety an organic acid, a photoacid generator, or a thermal acid generator is formed over the photoresist layer. A latent pattern is formed in the photoresist layer by selectively exposing the photoresist layer to actinic radiation. An acid is generated in the protective layer or acid in the protective layer is diffused into the photoresist layer. The protective layer is removed, and the photoresist layer is developed to form a pattern in the photoresist layer. In an embodiment, portions of the photoresist layer not exposed to the actinic radiation are removed during the developing the photoresist layer. In an embodiment, the acid generated in the protective layer is generated by exposing the protective layer to the actinic radiation. In an embodiment, the acid generated in the protective layer is generated by heating the protective layer. In an embodiment, the acid is diffused from the protective layer into the photoresist layer by heating the protective layer and the photoresist layer. In an embodiment, the photoacid generator is one or more selected from the group consisting of α-(trifluoromethylsulfonyloxy)-bicyclo[2.2.1]hept-5-ene-2,3-dicarb-o-ximide (MDT), N-hydroxynaphthalimide (DDSN), benzoin tosylate, t-butylphenyl-α-(p-toluenesulfonyloxy)-acetate and t-butyl-α-(p-toluenesulfonyloxy)-acetate, triarylsulfonium hexafluoroantimonates, triarylsulfonium hexafluoroarsenates, triarylsulfonium trifluoromethanesulfonates, diaryliodonium hexafluoroantimonates, diaryliodonium hexafluoroarsenates, diaryliodonium trifluoromethanesulfonates, iodonium perfluorooctanesulfonate, N-camphorsulfonyloxynaphthalimide, N-pentafluorophenylsulfonyloxynaphthalimide, ionic iodonium sulfonates, diaryl iodonium (alkyl or aryl) sulfonate, bis-(di-t-butylphenyl) iodonium camphanylsulfonate, perfluoroalkanesulfonates, perfluoropentanesulfonate, perfluorooctanesulfonate, perfluoromethanesulfonate, (phenyl or benzyl)triflates, triphenylsulfonium triflate, bis-(t-butylphenyl)iodonium triflate, trimesylate, pyrogallol, trifluoromethanesulfonate esters of hydroxyimides, α,α'-bis-sulfonyl-diazomethanes, sulfonate esters of nitro-substituted benzyl alcohols, naphthoquinone-4-diazides, and alkyl disulfones. In an embodiment, the photoacid generator is one or more selected from the group consisting of compounds formed from the anions and cations illustrated in FIG. 16. In an embodiment, the photoresist layer is heated at a temperature ranging from 40° C. to 120° C. prior to forming the protective layer. In an embodiment, the photoresist layer includes metal oxide nanoparticles. In an embodiment, the method includes heating the photoresist layer and protective layer at a temperature ranging from 40° C. to 120° C. after forming the protective layer. In an embodiment, the method includes heating the photoresist layer and protective layer at a temperature ranging from 50° C. to 150° C. after selectively exposing the photoresist layer. In an embodiment, the thermal acid generator is one or more selected from the group consisting of

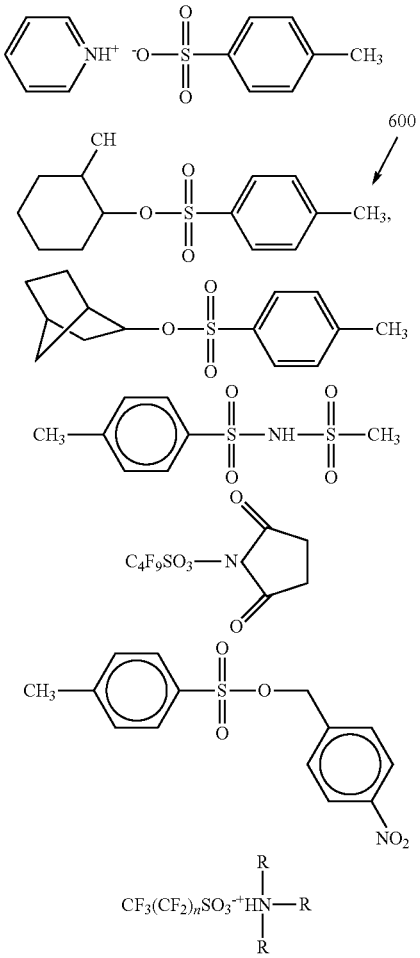

FIG. 6 where $0 \leq n \leq 10$, and R is hydrogen or a substituted or unsubstituted C1-C10 alkyl group. In an embodiment, the thermal acid generator is $NH_4^+C_4F_9SO_3^-$ or $NH_4^+CF_3SO_3^-$. In an embodiment, the organic acid is one or more selected from the group consisting of malonic acid, citric acid, nalic acid, succinic acid, benzoic acid, salicylic acid, a phosphorous oxo acid, phosphoric acid li-n-butyl ester, phosphoric acid diphenyl ester; a phosphonic acid, phosphonic acid dimethyl ester, phosphonic acid di-n-butyl ester, phenylphosphonic acid, phosphonic acid diphenyl ester, phosphonic acid dibenzyl ester, a phosphinic acid, phenylphosphinic acid, and a sulfonic acid.

Another embodiment of the disclosure is a method for manufacturing a semiconductor device, including forming a photoresist layer over a substrate, and forming a protective layer over the photoresist layer. The protective layer includes a polymer without a nitrogen-containing moiety, and a basic quencher, an organic acid, a photoacid generator, or a thermal acid generator. A latent pattern is formed in the photoresist layer by patternwise exposing the photoresist layer to radiation. The protective layer and the photoresist layer are heated after the patternwise exposing the photoresist layer to radiation. The protective layer is removed, and the latent pattern in the photoresist layer is developed to form a pattern in the photoresist layer. In an embodiment, the protective layer and photoresist layer are heated at a temperature ranging from 50° C. to 150° C. during the heating the protective layer and the photoresist layer. In an embodiment, the method includes heating the photoresist layer and protective layer at a temperature ranging from 40° C. to 120° C. before forming the latent pattern in the photoresist layer. In an embodiment, the radiation is electron beam, extreme ultraviolet, or deep ultraviolet. In an embodiment, the polymer does not contain acid labile groups. In an embodiment, the latent pattern is developed using a basic developer. In an embodiment, the basic developer is an aqueous tetramethyl ammonium hydroxide developer. In an embodiment, the protective layer has a thickness ranging from 0.1 nm to 20 nm. In an embodiment, a concentration of the basic quencher, organic acid, photoacid generator, or thermal acid generator ranges from 0.1 wt. % to 10 wt. % based on a weight of the polymer and the basic quencher, an organic acid, a photoacid generator, or a thermal acid generator. In an embodiment, the photoresist layer includes metal oxide nanoparticles.

Another embodiment of the disclosure is a method for manufacturing a semiconductor device, including forming a photoresist layer including a photoresist composition over a substrate. A protective layer including a polymer and a secondary or tertiary amine, a photobase generator, or a thermal base generator is formed over the photoresist layer. The photoresist layer is patternwise exposed to radiation to form a latent pattern in the photoresist layer. The protective layer and the photoresist layer are heated thereby generating a base or diffusing base in the protective layer into the photoresist layer. The photoresist layer is developed to form a pattern in the photoresist layer. In an embodiment, the protective layer is not a photoresist layer. In an embodiment, portions of the protective layer patternwise exposed to the radiation and portions of the protective layer not exposed to the radiation are removed during the developing the photoresist layer. In an embodiment, portions of the photoresist layer patternwise exposed to the radiation are removed during the developing the photoresist layer. In an embodiment, the patternwise exposing the photoresist layer to radiation further generates the base in the protective layer. In an embodiment, the photobase generator is one or more selected from the group consisting of quaternary ammonium dithiocarbamates, α aminoketones, oxime-urethane containing molecules, dibenzophenoneoxime hexamethylene diurethan, ammonium tetraorganylborate salts, and N-(2-nitrobenzyloxycarbonyl) cyclic amines, and combinations; thereof. In an embodiment, the thermal base generator is one or more selected from the group consisting of:

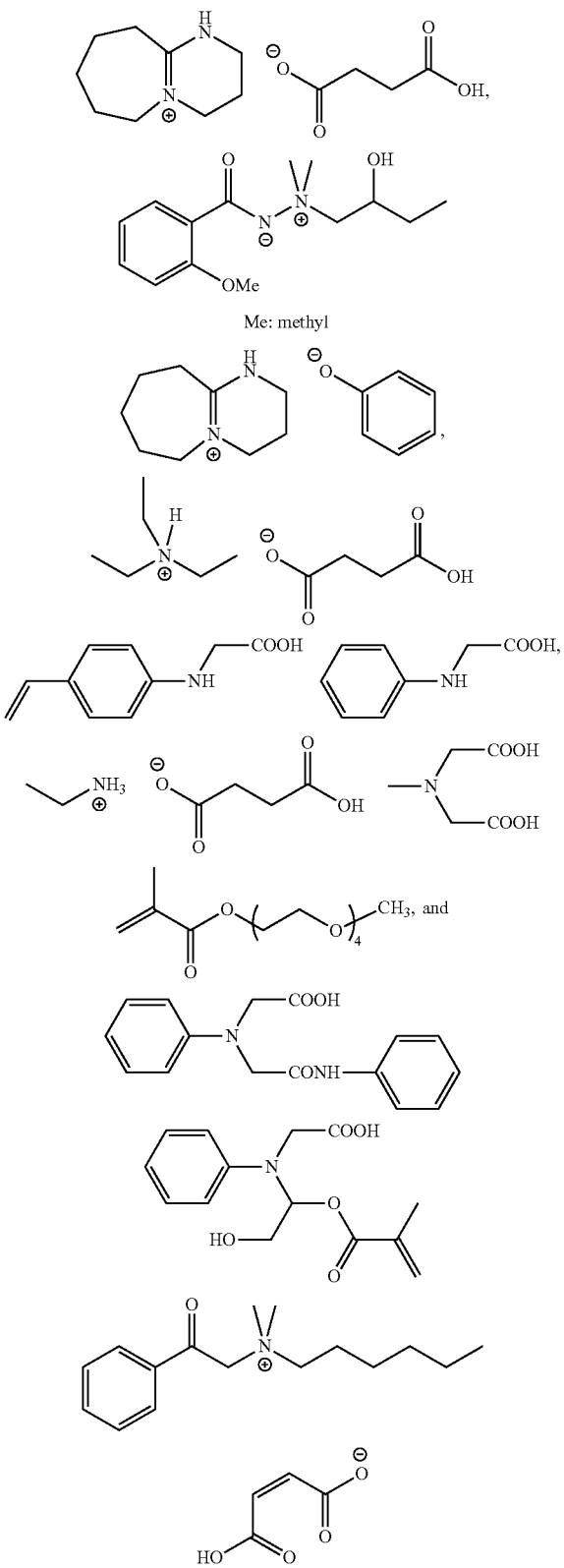

In an embodiment, the thermal base generator is N-(p-nitrophenyl)-2,6-dimethylpiperidine. In an embodiment, the secondary or tertiary amine is selected from the group consisting of:

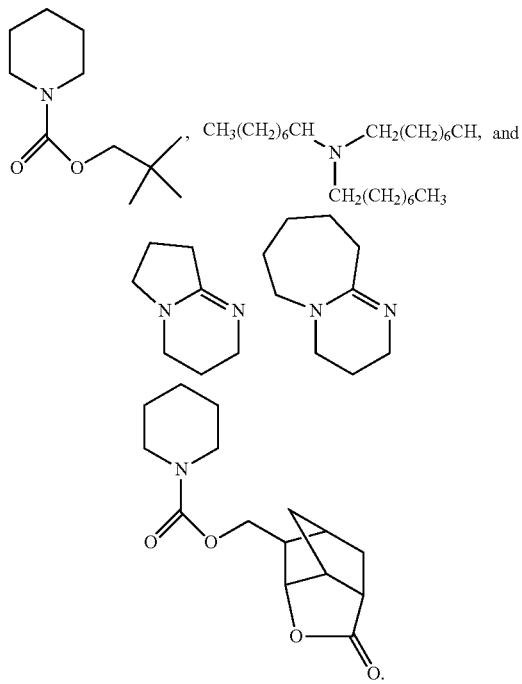

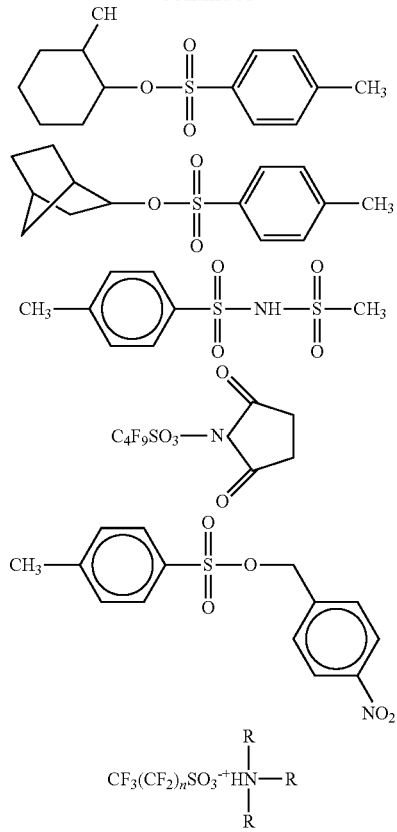

where 0≤n≤10, and R is hydrogen or a substituted or unsubstituted C1-C10 alkyl group. In an embodiment, the organic acid is one or more selected from the group consisting of malonic acid, citric acid, malic acid, succinic acid, benzoic acid, salicylic acid, a phosphorous oxo acid, phosphoric acid di-n-butyl ester, phosphoric acid diphenyl ester; a phosphonic acid, phosphonic acid dimethyl ester, phosphonic acid di-n-butyl ester, phenylphosphonic acid, phosphonic acid diphenyl ester, phosphonic acid dibenzyl ester, a phosphinic acid, phenylphosphinic acid, and a sulfonic acid. In an embodiment, the photoacid generator is one or more selected from the group consisting of α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium hexafluoroantimonates, triarylsulfonium hexafluoroarsenates, triarylsulfonium trifluoromethanesulfonates, diaryliodonium hexafluoroantimonates, diaryliodonium hexafluoroarsenates, diaryliodonium trifluoromethanesulfonates, iodonium perfluorooctanesulfonate, N-camphorsulfonyloxynaphthalimide, N-pentafluorophenylsulfonyloxynaphthalimide, ionic iodonium sulfonates, diaryl iodonium (alkyl or aryl) sulfonate, bis-(di-t-butylphenyl) iodonium camphanylsulfonate, perfluoroalkanesulfonates, perfluoropentanesulfonate, perfluorooctanesulfonate, perfluoromethanesulfonate, (phenyl or benzyl)triflates, triphenylsulfonium triflate, bis-(t-butylphenyl)iodonium triflate, trimesylate, pyrogallol, trifluoromethanesulfonate esters of hydroxyimides, α,α'-bis-sulfonyl-diazomethanes, sulfonate esters of nitro-substituted benzyl alcohols, naphthoquinone-4-diazides, and alkyl disulfones. In an embodiment, the photoresist layer is developed by a basic developer or an In an embodiment, the photobase generator has a formula: $R^1$—X—Y—$N^-$—$(SO_2)$—Rf-$M^+$, where $R^1$ is a substituted or unsubstituted C5-C18 alicyclic group, X is a divalent linking group, Y is a linear, branched, or cyclic C2-C18 alkylene group or C6-C18 arylene group, Rf is a C1-C5 fluorocarbon group, and M is an organic cation or a metal cation.

Another embodiment of the disclosure is a method for manufacturing a semiconductor device, including forming a photoresist layer including a photoresist composition over a substrate. A protective layer including a polymer without a nitrogen-containing moiety, and an organic acid, a photoacid generator, or a thermal acid generator is formed over the photoresist layer. The photoresist layer is patternwise exposed to radiation to form a latent pattern in the photoresist layer. The protective layer and the photoresist layer are heated thereby generating an acid or diffusing acid in the protective layer into the photoresist layer. The photoresist layer is developed to form a pattern in the photoresist layer. In an embodiment, the protective layer is not a photoresist layer. In an embodiment, portions of the protective layer patternwise exposed to the radiation and portions of the protective layer not exposed to the radiation are removed during the developing the photoresist layer. In an embodiment, portions of the photoresist layer not patternwise exposed to the radiation are removed during the developing the photoresist layer. In an embodiment, the patternwise exposing the photoresist layer to radiation further generates the acid in the protective layer. In an embodiment, the thermal acid generator is one or more selected from the group consisting of

FIG. 6

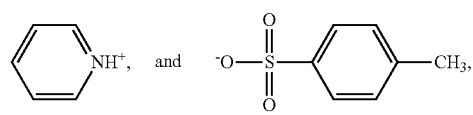

organic developer. In an embodiment, the polymer without a nitrogen-containing moiety is selected from the group consisting of a polyacrylate, a polymethylmethacrylate, a polyfluoroalcohol, a polyester, a polyimide, a polyether, and a polyalcohol, wherein the polymer does not contain acid labile groups.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a photoresist pattern, comprising:
    forming a photoresist layer comprising a photoresist composition over a substrate;
    forming a protective layer comprising a polymer without a nitrogen-containing moiety, and a photoacid generator or a thermal acid generator over the photoresist layer,
    wherein the photoacid generator is one or more selected from the group consisting of α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium hexafluoroantimonates, triarylsulfonium hexafluoroarsenates, diaryliodonium hexafluoroantimonates, diaryliodonium hexafluoroarsenates, iodonium perfluorooctanesulfonate, N-camphorsulfonyloxynaphthalimide, N-pentafluorophenylsulfonyloxynaphthalimide, bis-(di-t-butylphenyl)iodonium camphanylsulfonate, perfluoropentanesulfonate, trimesylate, pyrogallol, trifluoromethanesulfonate esters of hydroxyimides, α,α'-bis-sulfonyl-diazomethanes, sulfonate esters of nitro-substituted benzyl alcohols, naphthoquinone-4-diazides, and alkyl disulfones, or the photoacid generator comprises

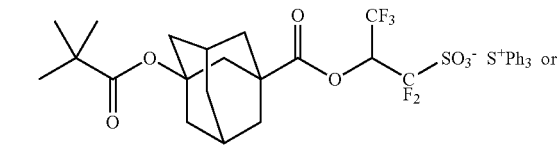

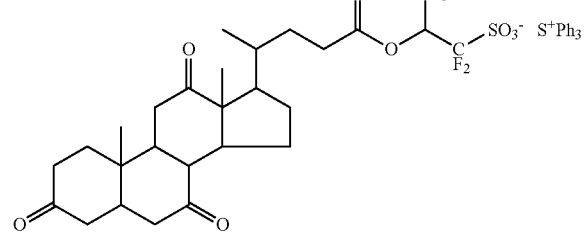

or one or more compounds made of a cation and an anion selected from the group consisting of:

cations

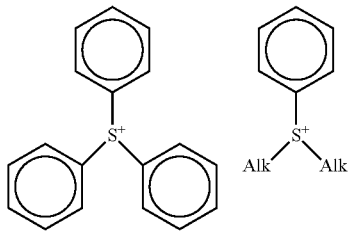

anions

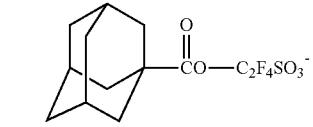

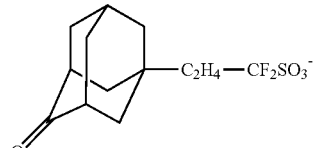

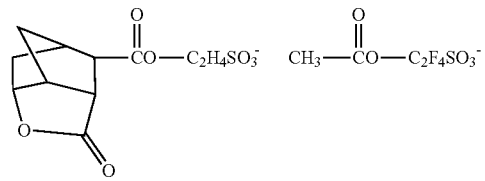

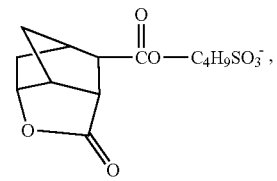

wherein the thermal acid generator is one or more selected from the group consisting of

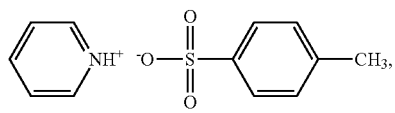

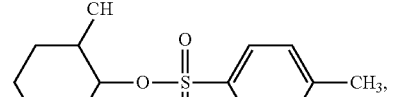

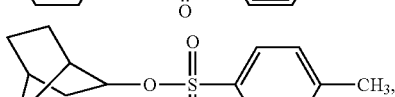

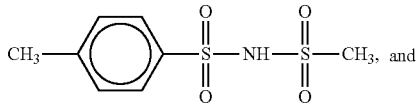

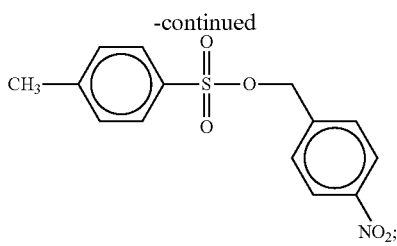

forming a latent pattern in the photoresist layer by selectively exposing the photoresist layer to actinic radiation;

generating an acid in the protective layer or diffusing acid in the protective layer into the photoresist layer, removing the protective layer, and developing the photoresist layer to form a pattern in the photoresist layer.

2. The method according to claim 1, wherein portions of the photoresist layer not exposed to the actinic radiation are removed during the developing the photoresist layer.

3. The method according to claim 1, wherein the acid generated in the protective layer is generated by exposing the protective layer to the actinic radiation.

4. The method according to claim 1, wherein the acid generated in the protective layer is generated by heating the protective layer.

5. The method according to claim 1, wherein the acid is diffused from the protective layer into the photoresist layer by heating the protective layer and the photoresist layer.

6. The method according to claim 1, wherein the protective layer includes a photoacid generator, and the photoacid generator is one or more selected from the group consisting of wherein the photoacid generator is one or more selected from the group consisting of α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium hexafluoroantimonates, triarylsulfonium hexafluoroarsenates, diaryliodonium hexafluoroantimonates, diaryliodonium hexafluoroarsenates, iodonium perfluorooctanesulfonate, N-camphorsulfonyloxynaphthalimide, N-pentafluorophenylsulfonyloxynaphthalimide, bis-(di-t-butylphenyl)iodonium camphanylsulfonate, perfluoropentanesulfonate, trimesylate, pyrogallol, trifluoromethanesulfonate esters of hydroxyimides, α,α'-bis-sulfonyldiazomethanes, sulfonate esters of nitro-substituted benzyl alcohols, naphthoquinone-4-diazides, and alkyl disulfones.

7. The method according to claim 1, wherein the protective layer includes a thermal acid generator, and thermal acid generator is one or more selected from the group consisting of

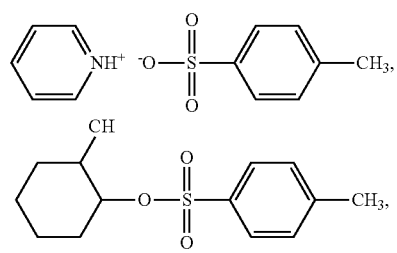

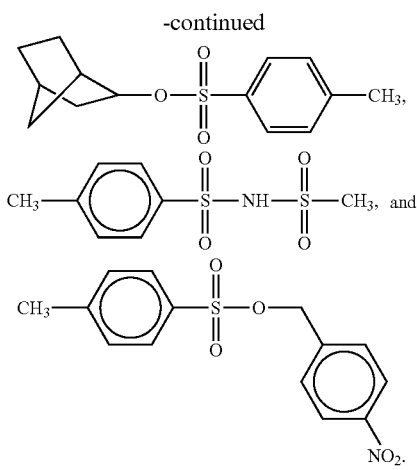

8. A method of forming a photoresist pattern, comprising:

forming a protective layer over a photoresist layer formed on a substrate;

selectively exposing the protective layer and the photoresist layer to actinic radiation; and developing the photoresist layer to form a pattern in the photoresist layer, wherein the protective layer comprises a polymer without a nitrogen-containing moiety, and one or more thermal acid generators selected from the group consisting of

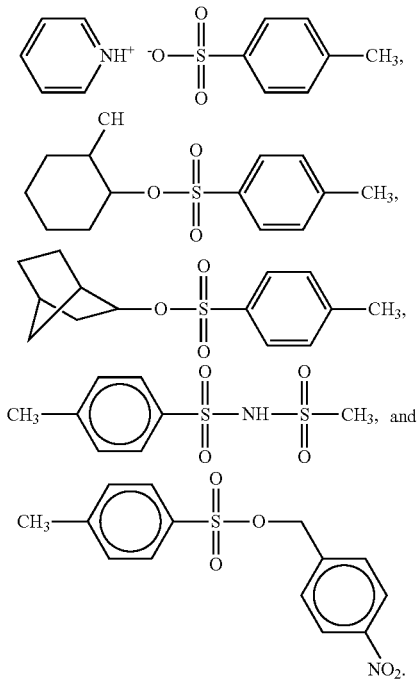

9. The method according to claim 8, wherein a concentration of the thermal acid generator in the protective layer ranges from 0.1 wt. % to 10 wt. % based on a weight of the polymer and the thermal acid generator.

10. The method according to claim 8, wherein the polymer without a nitrogen-containing moiety is selected from the group consisting of a polyacrylate, a polymethylmethacrylate, a polyfluoroalcohol, a polyester, a polyether, and a polyalcohol.

11. The method according to claim 10, wherein the polymer does not include acid labile groups.

12. A method for manufacturing a semiconductor device, comprising:
forming a photoresist layer over a substrate;
forming a protective layer over the photoresist layer, wherein the protective layer comprises a polymer without a nitrogen-containing moiety, and a photoacid generator;
forming a latent pattern in the photoresist layer by patternwise exposing the photoresist layer to radiation;
heating the protective layer and the photoresist layer after the patternwise exposing the photoresist layer to radiation;
removing the protective layer; and
developing the latent pattern in the photoresist layer to form a pattern in the photoresist layer,
wherein the photoacid generator is one or more selected from the group consisting of α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium hexafluoroantimonates, triarylsulfonium hexafluoroarsenates, diaryliodonium hexafluoroantimonates, diaryliodonium hexafluoroarsenates, iodonium perfluorooctanesulfonate, N-camphorsulfonyloxynaphthalimide, N-pentafluorophenylsulfonyloxynaphthalimide, bis-(di-t-butylphenyl)iodonium camphanylsulfonate, perfluoropentanesulfonate, trimesylate, pyrogallol, trifluoromethanesulfonate esters of hydroxyimides, α,α'-bis-sulfonyl-diazomethanes, sulfonate esters of nitro-substituted benzyl alcohols, naphthoquinone-4-diazides, and alkyl disulfones, or the photoacid generator comprises

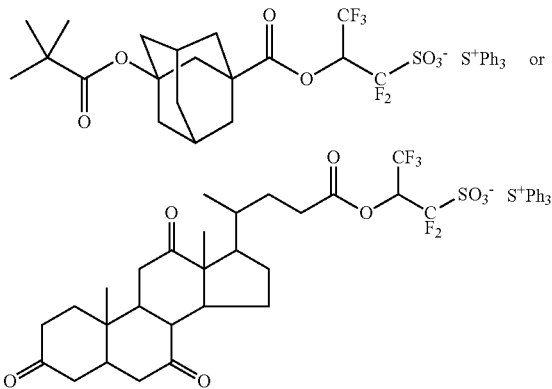

or one or more compounds made of a cation and an anion selected from the group consisting of:

cations

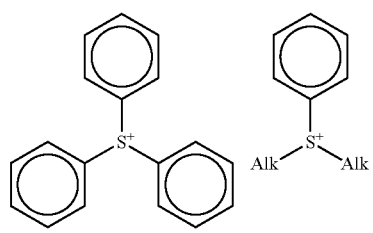

anions

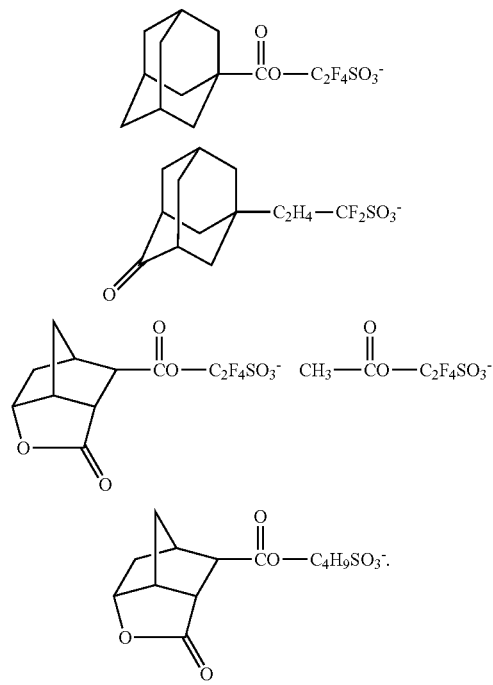

13. The method according to claim 12, wherein the protective layer and photoresist layer are heated at a temperature ranging from 50° C. to 150° C. during the heating the protective layer and the photoresist layer.

14. The method according to claim 12, wherein the polymer does not contain acid labile groups.

15. The method according to claim 12, wherein the latent pattern is developed using a basic developer.

16. The method according to claim 12, wherein a concentration of the photoacid generator ranges from 0.1 wt. % to 10 wt. % based on a weight of the polymer and the photoacid generator.

17. The method according to claim 1, wherein the protective layer includes the photoacid generator, and the photoacid generator comprises:

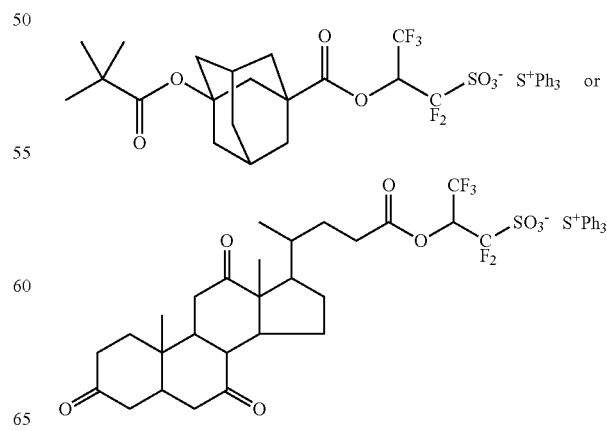

or one or more compounds made of a cation and an anion selected from the group consisting of:

cations

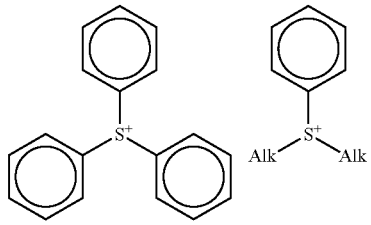

anions

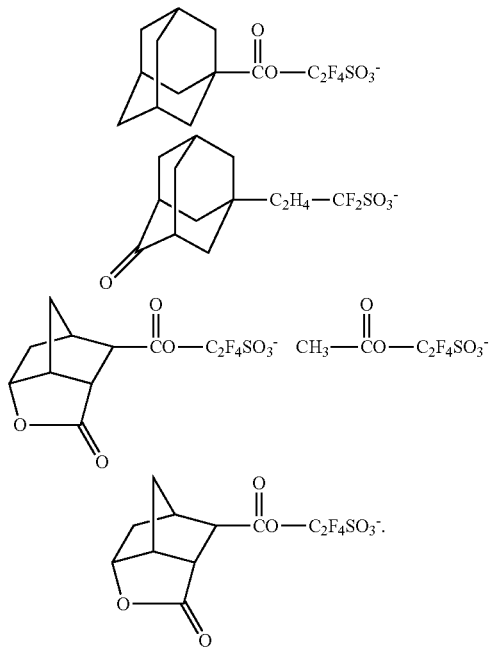

18. The method according to claim 12, wherein the protective layer includes the photoacid generator, and the photoacid generator comprises:

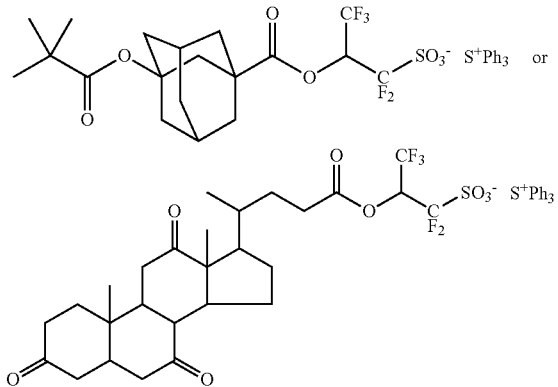

or one or more compounds made of a cation and an anion selected from the group consisting of:

cations

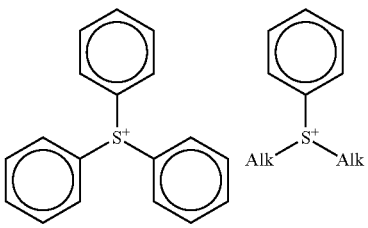

anions

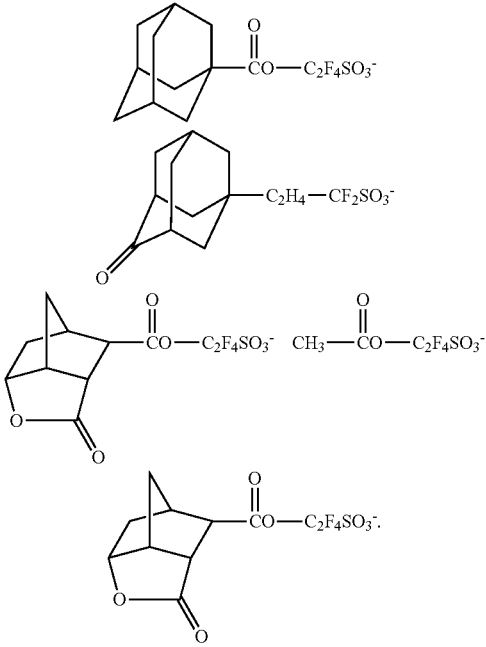

19. The method according to claim 1, wherein the protective layer includes a photoacid generator, and the photoacid generator is one or more selected from the group consisting of wherein the photoacid generator is one or more selected from the group consisting of α-(trifluoromethyl-sulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium hexafluoroantimonates, triarylsulfonium hexafluoroarsenates, diaryliodonium hexafluoroantimonates, diaryliodonium hexafluoroarsenates, iodonium perfluorooctanesulfonate, N-camphorsulfonyloxynaphthalimide, N-pentafluorophenylsulfonyloxynaphthalimide, bis-(di-t-butylphenyl)iodonium camphanylsulfonate, perfluoropentanesulfonate, perfluorooctanesulfonate, bis-(t-butylphenyl) iodonium triflate, trimesylate, pyrogallol, trifluoromethanesulfonate esters of hydroxyimides, α,α'-bis-sulfonyl-diazomethanes, sulfonate esters of nitro-substituted benzyl alcohols, naphthoquinone-4-diazides, and alkyl disulfones.

20. The method according to claim 8, wherein the polymer without a nitrogen-containing moiety is selected from the group consisting of a polyfluoroalcohol, a polyester, and a polyether.

* * * * *